(12) United States Patent
Dick et al.

(10) Patent No.: US 6,876,698 B1
(45) Date of Patent: Apr. 5, 2005

(54) TUNABLE NARROW-BAND FILTER INCLUDING SIGMA-DELTA MODULATOR

(75) Inventors: Christopher H. Dick, San Jose, CA (US); Frederic J. Harris, San Diego, CA (US)

(73) Assignee: Xilinx, Inc., San Jose, CA (US)

( * ) Notice: Subject to any disclaimer, the term of this patent is extended or adjusted under 35 U.S.C. 154(b) by 693 days.

(21) Appl. No.: 09/665,884

(22) Filed: Sep. 20, 2000

Related U.S. Application Data

(63) Continuation-in-part of application No. 09/394,123, filed on Sep. 10, 1999.

(51) Int. Cl.[7] .............................................. H03H 7/30
(52) U.S. Cl. ...................... 375/229; 375/222; 341/143; 379/387.01
(58) Field of Search ................................ 375/229, 222, 375/245, 345, 244; 341/143, 166; 379/387.01

(56) References Cited

U.S. PATENT DOCUMENTS

| | | | |
|---|---|---|---|
| 5,162,799 A | * | 11/1992 | Tanimoto ..................... 341/143 |
| 5,311,181 A | * | 5/1994 | Ferguson et al. ............ 341/143 |
| 5,442,353 A | * | 8/1995 | Jackson ....................... 341/143 |
| 5,471,209 A | * | 11/1995 | Sutterlin et al. ............ 341/143 |
| 5,736,950 A | * | 4/1998 | Harris et al. ................ 341/143 |
| 6,104,794 A | * | 8/2000 | Hein et al. ............. 379/387.01 |
| 6,289,044 B1 | * | 9/2001 | Velez et al. .................. 375/222 |

OTHER PUBLICATIONS

Fredric J. Harris et al.; Configurable Logic for Digital Communications: Some Signal Processing Perspectives; IEEE Communications Magazine; Aug. 1999; p. 107–111.*

Hwang, Kai, "Computer Arithmetic Principles, Architecture, and Design" ; Copyright 1979 by John Wiley & Sons, Inc.; pp. 152–155.

Marvin E. Frerking, "Digital Signal Processing in Communication Systems", published by Van Nostrand Reinhold, New York, 1994, pp. 124–128 and 171–174.

John R. Deller, Jr. et al., "Discrete Time Processing of Speech Signals", published by Macmillan Publishing Company, Maxwell Macmillan International, New York, 1993, pp. 273–280.

"The Programmable Logic Data Book", 1999, available from Xilinx, Inc., 2100 Logic Drive, San Jose, California 95124, pp. 6–5 to 6–41.

L. Mintzer, "FIR Filters with Field–Programmable Gate Arrays", Journal of VLSI Signal Processing, No. 6, 1993, pp. 119–127.

S. Mohanakrishnan et al., "Automatic Implementation of FIR Filters on Field Programmable Gate Arrays", IEEE Signal Processing Letters, vol. 2, No. 3, Mar. 1995, pp. 51–53.

D. Patterson et al., "Computer Architecture: A Quantitative Approach", Morgan Kaufmann Publishers, Inc., California, 1990, pp. A8–A10.

(Continued)

*Primary Examiner*—Stephen Chin
*Assistant Examiner*—Sudhanshu C. Pathak
(74) *Attorney, Agent, or Firm*—Arthur J. Behiel; Bernard S. Hoffman; Justin Liu

(57) ABSTRACT

A tunable narrow-band filter that includes a sigma-delta modulator. In one embodiment, a conventional DC canceler is modified to include a re-quantizer in the feedback loop in the form of a $\Sigma\Delta$ modulator. In another embodiment, a digital receiver employs a processing chip, such as an FPGA, that includes a $\Sigma\Delta$ modulator to requantize oversampled control signals in the digital receiver. In still another embodiment, a wide-bandwidth sigma-delta loop has a tunable center frequency.

17 Claims, 20 Drawing Sheets

OTHER PUBLICATIONS

C.H.Dick and F.J. Harris; "FPGA Signal Processing Using Sigma–Delta Modulation"; IEEE Signal Processing Magazine, Jan. 2000.

Atmel AT40K/05/10/20/40 Data Sheet, 1999.

A. Peled and B. Liu, "A New Hardware Realization of Digital Filters" IEEE Trans. on Acoust., Speech, Signal Processing, vol. 22, pp. 456–462, Dec. 1974.

S.A. White, "Applications of Distributed Arithmetic to Digital Signal Processing" IEEE ASSP Magazine, vol. 6(3), pp. 4–19, Jul. 1989.

Application Note AN10, entitled "Delta Sigma A/D Conversion Technique Overview" Jan. 1997, available from Crystal Semiconductor Corporation, P.O. Box 17847, Austin TX 78760, http://www.crystal.com, pp. 1–10.

Multidimensional autoregression Chapter 6, pp. 135–169.

C.H. Dick and F. Harris, "Fir Filtering with FPGAs Using Quadrature Sigma–Delta Modulation Encoding", 6th Int. Workshop on Field–Programmable Logic and Applications, FPL Sep. 1996, Darmstadt, Germany.

* cited by examiner

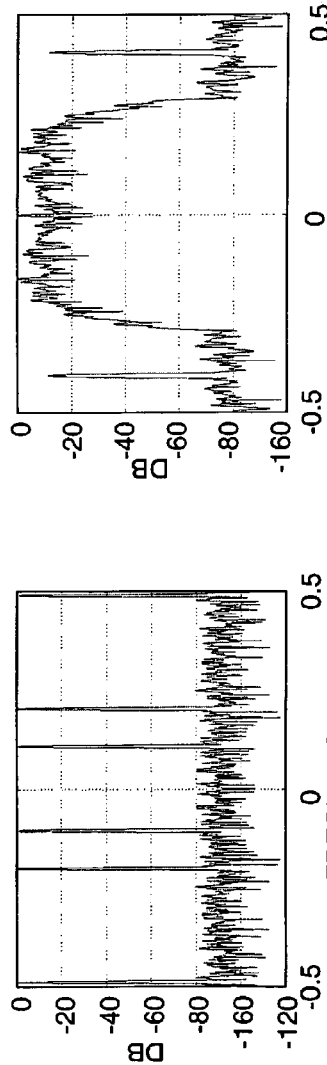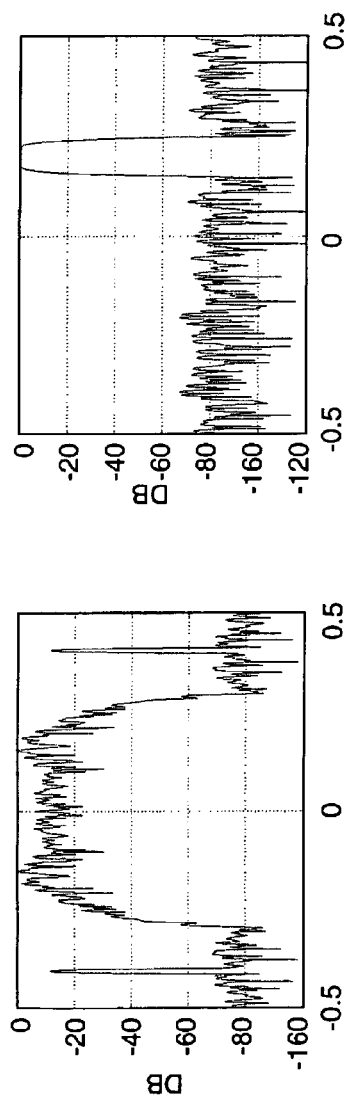
FIG. 16A PRIOR ART
FIG. 16B PRIOR ART
FIG. 16C PRIOR ART
FIG. 16D PRIOR ART

TUNABLE NARROW-BAND FILTER INCLUDING SIGMA-DELTA MODULATOR

CROSS-REFERENCE TO RELATED APPLICATION

This is a continuation-in-part of U.S. patent application Ser. No. 09/394,123 filed Sep. 10, 1999 entitled "Narrow Band Filter Including Sigma-Delta Modulator Implemented in a Programmable Logic Device", incorporated herein by reference.

BACKGROUND

While ΣΔM techniques are applied widely in analog conversion sub-systems, both analog-to-digital (ADC) and digital-to-analog (DAC) converters, these methods have enjoyed much less exposure in the broader application domain, where flexible and configurable solutions, traditionally supplied via a software DSP (soft-DSP), are required. And this limited level of exposure is easy to understand. Most, if not all, of the efficiencies and optimizations afforded by ΣΔM are hardware oriented and so cannot be capitalized on in the fixed precision pre-defined datapath found in a soft-DSP processor. This limitation, of course, does not exist in a field programmable gate array (FPGA) DSP solution. With FPGAs the designer has complete control of the silicon to implement any desired datapath and employ optimal word precisions in the system with the objective of producing a design that satisfies the specifications in the most economically sensitive manner.

While implementation of a digital ΣΔ ASIC (application-specific integrated circuit) is of course possible, economic constraints make the implementation of such a building block that would provide the flexibility, and be generic enough to cover a broad market cross-section, impractical. FPGA-based hardware provides a solution to this problem. FPGAs are off-the-shelf commodity items that provide a silicon feature set ideal for constructing high-performance DSP systems. These devices maintain the flexibility of software-based solutions, while providing levels of performance that match, and often exceed, ASIC solutions.

There is a rich and expanding body of literature devoted to the efficient and effective implementation of digital signal processors using FPGA based hardware. More often than not, the most successful of these techniques involves a paradigm shift away from the methods that provide good solutions in software programmable DSP systems.

Semiconductor vendors, such as Xilinx, Altera, Atmel, and AT&T, provide a range of FPGAs. The architectural approaches are as diverse as there are manufacturers, but some generalizations can be made. Most of the devices are basically organized as an array of logic elements and programmable routing resources used to provide the connectivity between the logic elements, FPGA I/O pins and other resources, such as on-chip memory. The structure and complexity of the logic elements, as well as the organization and functionality supported by the interconnection hierarchy, distinguish the devices. Other device features, such as block memory and delay locked loop technology, are also significant factors that influence the complexity and performance of an algorithm that is implemented using FPGAs.

A logic element usually consists of one or more RAM (random access memory) n-input look-up tables, where n is between 3 and 6, in one to several flip-flops. There may also be additional hardware support in each element to enable high-speed arithmetic operations. This generic FPGA architecture is shown in FIG. 1. Also illustrated in the Figure (as wide lines) are several connections between logic elements and the device input/output (I/O) ports. Application-specific circuitry is supported in the device by downloading a bit stream into SRAM (static random access memory) based configuration memory. This personalization database defines the functionality of the logic elements, as well as the internal routing. Different applications are supported on the same FPGA hardware platform by configuring the FPGA(s) with appropriate bit streams. As a specific example, consider the Xilinx Virtex™ series of FPGAs. The logic elements, called slices, essentially consist of two four-input look-up tables (LUTs), two flip-flops, several multiplexors and some additional silicon support that allows the efficient implementation of carry-chains for building high-speed adders, subtracters, and shift registers. Two slices form a configurable logic block (CLB) as shown in FIG. 2. The CLB is the basic tile that is used to build the logic matrix. Some FPGAs, like the Xilinx Virtex families, supplying on-chip block RAM. FIG. 3 shows the CLB matrix that defines a Virtex FPGA. Current generation Virtex silicon provides a family of devices offering 768 to 12,288 logic slices, and from 8 to 32 variable form factor block memories.

Xilinx XC4000 and Virtex devices also allow the designer to use the logic element LUTs as memory, either ROM or RAM. Constructing memory with this distributed memory approach can yield access bandwidths in many tens of gigabytes per second range.

Typical clock frequencies for current generation devices are in the multiple tenants of megahertz (100 to 200) range.

In contrast to the logic slice architecture employed in Xilinx Virtex devices, a logic block architecture employed in the Atmel AT40K FPGA is shown in FIG. 4. Like the Xilinx device, combinational logic is realized using look-up tables. In this case, two three-input LUTs and a single flip-flop are available in each logic cell. The pass gates in a cell form part of the signal routing network and are used for connecting signals to the multiple horizontal and vertical bus planes. In addition to the orthogonal routing resources, indicated as N, S, E and W in FIG. 4, a diagonal group of interconnects (NW, NE, SE, and SW), associated with each cell x output, are available to provide efficient connections to neighboring cell's x bus inputs.

The objective of the FPGA/DSP architect is to formulate algorithmic solutions for applications that best utilize FPGA resources to achieve the required functionality. This is a three-dimensional optimization problem in power, complexity, and bandwidth. The remainder of this application describes some novel FPGA solutions to several signal processing problems. The results are important in an industrial context because they enable either smaller, and hence more economic, solutions to important problems, or allow more arithmetic compute power to be realized with a given area of silicon.

ΣΔ Modulation

Sigma-Delta modulation is a source coding technique most prominently employed in analog-to-digital and digital-to-analog converters. In this context, hybrid analog and digital circuits are used in the realization. FIG. 5 shows a single-loop ΣΔ modulator. Provided the input signal is busy enough, the linearized discrete time model of FIG. 6 can be used to illustrate the principle. In FIG. 6, the 1-bit quantizer is modeled by an additive white noise source with variance $\sigma_e^2 = \Delta^2/12$, where $\Delta$ represents the quantization interval. The z-transform of the system is $$Y(z) = \frac{H(z)}{1+H(z)}X(z) + \frac{1}{1+H(z)}Q(z) \qquad \text{Equations 1 and 2}$$
$$= H_s(z)X(z) + H_n(z)Q(z)$$

where $$H(z) = \frac{1}{z-1} \qquad \text{Equation 3}$$

which is the transfer function of delay and an ideal integrator, and $H_s(z)$ and $H_n(z)$ are the signal and noise transfer functions (NTF) respectively. In a good $\Sigma\Delta$ modulator, $H_s(\omega)$ will have a flat frequency response in the interval $|f| \leq B$. In contrast, $H_n(\omega)$ will have a high attenuation in the frequency band $|f| \leq B$ and a "don't care" region in the interval $B < |f| < f_s/2$. For the single loop $\Sigma\Delta$ in FIG. 6, $H_s(z) = z^{-1}$ and $H_n(z) = 1 - z^{-1}$. Thus the input signal is not distorted in any way by the network and simply experiences a pure delay from input to output. The performance of the system is determined by the noise transfer function $H_n(z)$, which is given by $$|H_n(f)| = 4\left|\sin\frac{\pi f}{f_s}\right| \qquad \text{Equation 4}$$

and is shown in FIG. 7. The in-band quantization noise variance is $$\sigma_n^2 = \int_{-B}^{+B} |H_n(f)|^2 S_q(f)df \qquad \text{Equation 5}$$

where $S_q(f) = \sigma_q^2/f_s$ is the power spectral density of the quantization noise. Observe that for a non-shaped noise (or white) spectrum, increasing the sampling rate by a factor of 2, while keeping the bandwidth B fixed, reduces the quantization noise by 3 dB. For a first order $\Sigma\Delta M$ it can be shown that $$\sigma_n^2 \approx \frac{1}{3}\pi^2\sigma_q^2\left(\frac{2B}{f_s}\right)^3 \qquad \text{Equation 6}$$

for $f_s \gg 2B$. Under these conditions doubling the sampling frequency reduces the noise power by 9 dB, of which 3 dB is due to the reduction in $S_q(f)$ and a further 6 dB is due to the filter characteristic $H_n(f)$. The noise power is reduced by increasing the sampling rate to spread the quantization noise over a large bandwidth and then by shaping the power spectrum using an appropriate filter.

Reduced Complexity Filters Using $\Sigma\Delta$ Modulation Techniques $\Sigma\Delta M$ techniques can be employed for realizing area efficient narrowband filters in FPGAs. These filters are utilized in many applications. For example, narrow-band communication receivers, multi-channel RF surveillance systems and for solving some spectrum management problems.

A uniform quantizer operating at the Nyquist rate is the standard solution to the problem of representing data within a specified dynamic range. Each additional bit of resolution in the quantizer provides an increase in dynamic range of approximately 6 dB. A signal with 60 dB of dynamic range requires 10 bits, while 16 bits can represent data with a dynamic range of 96 dB.

While the required dynamic range of a system fixes the number of bits required to represent the data, it also affects the expense of subsequent arithmetic operations, in particular multiplications. In any hardware implementation, and of course this includes FPGA based DSP processors, there are strong economic imperatives to minimize the number and complexity of the arithmetic components employed in the datapath. An embodiment of the invention employs noise-shaping techniques to reduce the precision of the input data samples to minimize the complexity of the multiply-accumulate (MAC) units in the filter. The net result is a reduction in the amount of FPGA logic resources required to realize the specified filter.

Consider the structure shown in FIG. 8. Instead of applying the quantized data x(n) from the analog-to-digital converter directly to the filter, data x(n) is pre-processed by a $\Sigma\Delta$ modulator. The re-quantized input samples $\hat{x}(n)$ are represented using fewer bits per sample, so permitting the subsequent filter H(z) to employ reduced precision multipliers in the mechanization. The filter coefficients are still kept to a high precision.

The $\Sigma\Delta$ data re-quantizer is based on a single loop error feedback sigma-delta modulator shown in FIG. 9. In this configuration, the difference between the quantizer input and output sample is a measure of the quantization error, which is fed back and combined with the next input sample. The error-feedback sigma-delta modulator operates on a highly oversampled input and uses the unit delay z-1 as a predictor. With this basic error-feedback modulator, only a small fraction of the bandwidth can be occupied by the required signal. In addition, the circuit only operates at baseband. A larger fraction of the Nyquist bandwidth can be made available and the modulator can be tuned if a more sophisticated error predictor is employed. This requires replacing the unit delay with a prediction filter P(z). This generalized modulator is shown in FIG. 10.

The operation of the re-quantizer can be understood by considering the transform domain description of the circuit. This is expressed as $$\hat{X}(z) = X(z) + Q(z)(1 - P(z)z^{-1}) \qquad \text{Equation 7}$$

where Q(z) is the z-transform of the equivalent noise source added by the quantizer q(•), P(z) is the transfer function of the error predictor filter, and X(z) and $\hat{X}(z)$ are the transforms of the system input and output respectively. P(z) is designed to have unity gain and leading phase shift in the bandwidth of interest. Within the design bandwidth, the term $Q(z)(1-P(z)z^{-1}) = 0$ and so $X(z) = \hat{X}(z)$. By designing P(z) to be commensurate with the system passband specifications, the in-band spectrum of the re-quantizer output will ideally be the same as the corresponding spectral region of the input signal.

To illustrate the operation of the system consider the task of recovering a signal that occupies 10% of the available bandwidth and is centered at a normalized frequency of 0.3 Hz. The stopband requirement is to provide 60 dB of attenuation. FIG. 11A shows the input test signal. It comprises an in-band component and two out-of-band tones that are to be rejected. FIG. 11B is a frequency domain plot of the signal after it has been re-quantized to 4 bits of precision by a $\Sigma\Delta$ modulator employing an 8th order predictor in the feedback path. Notice that the 60 dB dynamic range requirement is supported in the bandwidth of interest, but that the out-of-band SNR has been compromised. This is of course acceptable, since the subsequent filtering operation will provide the necessary rejection. A 160-tap filter H(z) satisfies the problem specifications. The frequency response of H(z) using 12-bit filter coefficients is shown in FIG. 11C. Finally, H(z) is applied to the reduced sample precision data stream $\hat{X}(z)$ to produce the spectrum shown in FIG. 11D. Observe that the desired tone has been recovered, the two out-of-band components have been rejected, and that the in-band dynamic range meets the 60 dB requirement.

Prediction Filter Design

The design of the error predictor filter is a signal estimation problem. The optimum predictor is designed from a statistical viewpoint. The optimization criterion is based on the minimization of the mean-squared error. As a consequence, only the second-order statistics (autocorrelation function) of a stationary process are required in the determination of the filter. The error predictor filter is designed to predict samples of a band-limited white noise process $N_{xx}(\omega)$ shown in FIG. 12. $N_{xx}(\omega)$ is defined as:

$$N_{xx}(\omega) = \begin{cases} 1 & -\theta \leq \omega \leq \theta \\ 0 & \text{otherwise} \end{cases} \quad \text{Equation 8}$$

and related to the autocorrelation sequence $r_{xx}(m)$ by discrete-time Fourier transform (DTFT).

$$N_{xx}(\omega) = \sum_{n=-\infty}^{\infty} r_{xx}(k)e^{-j\omega n} \quad \text{Equation 9}$$

The autocorrelation function $r_{xx}(n)$ is found by taking the inverse DTFT of the equation immediately above.

$$r_{xx}(n) = \frac{1}{2\pi}\int_{-\pi}^{\pi} N_{xx}(\omega)e^{-j\omega n}d\omega \quad \text{Equation 10}$$

$N_{xx}(\omega)$ is non-zero only in the interval $-\theta \leq \omega \leq \theta$ giving $r_{xx}(n)$ as:

$$r_{xx}(n) = \frac{\theta}{\pi}\text{sinc}(\theta n) \quad \text{Equation 11}$$

So the autocorrelation function corresponding to a band-limited white noise power spectrum is a sinc function. Samples of this function are used to construct an autocorrelation matrix which is used in the solution of the normal equations to find the required coefficients. Leaving out the scaling factor in the immediately above equation, the required autocorrelation function $r_{xx}(n)$, truncated to p samples, is defined as:

$$r_{xx} = \frac{\sin(n\theta)}{n\theta} \quad n = 0, \ldots, p-1 \quad \text{Equation 12}$$

The normal equations are defined as:

$$r_{xx}(m) = \sum_{k=1}^{p} a(k)r_{xx}(m-k) \quad m = 1, 2, \ldots, p \quad \text{Equation 13}$$

This system of equations can be compactly written in matrix form by first defining several matrices.

To design a p-tap error predictor filter first compute a sinc function consisting of p+1 samples and construct the autocorrelation matrix $R_{xx}$ as:

$$R_{xx} = \begin{bmatrix} r_{xx}(0) & r_{xx}(1) & \ldots & r_{xx}(p-1) \\ r_{xx}(1) & r_{xx}(0) & \ldots & r_{xx}(p-2) \\ \vdots & \vdots & \vdots & \vdots \\ r_{xx}(p-1) & r_{xx}(p-2) & \ldots & r_{xx}(0) \end{bmatrix} \quad \text{Equation 14}$$

Next, define a filter coefficient row-vector A as:

$$A = [a(0), a(1), \ldots, a(p-1)] \quad \text{Equation 15}$$

where $a(i)$, $i=0, \ldots, p-1$, are the predictor filter coefficients. Let the row-vector $R_{xx}'$ be defined as:

$$R_{xx}' = [r_{xx}(1), r_{xx}(2), \ldots, r_{xx}(p)] \quad \text{Equation 16}$$

The matrix equivalent of equation 13 is:

$$R_{xx}A^T = (R_{xx}')^T \quad \text{Equation 17}$$

The filter coefficients are therefore given as:

$$A^T = R_{xx}^{-1}(R_{xx}')^T \quad \text{Equation 18}$$

For the case in-hand, the solution of equation 18 is an ill-conditioned problem. To arrive at a solution for A, a small constant $\epsilon$ is added to the elements along the diagonal of the autocorrelation matrix $R_{xx}$ in order to raise its condition number. The actual autocorrelation matrix used to solve for the predictor filter coefficients is:

$$R_{xx} = \begin{bmatrix} r_{xx}(0)+\varepsilon & r_{xx}(1) & \ldots & r_{xx}(p-1) \\ r_{xx}(1) & r_{xx}(0)+\varepsilon & \ldots & r_{xx}(M-2) \\ \vdots & \vdots & \vdots & \vdots \\ r_{xx}(p-1) & r_{xx}(p-2) & \ldots & r_{xx}(0)+\varepsilon \end{bmatrix} \quad \text{Equation 19}$$

Bandpass Predictor Filter

The previous section described the design of a lowpass predictor. In this section, bandpass processes are considered.

A bandpass predictor filter is designed by modulating a lowpass prototype sinc function to the required center frequency $\theta_0$. The bandpass predictor coefficient $h_{BP}(n)$ is obtained from the prototype lowpass sinc function $h_{LP}(n)$ as:

$$\text{sinc}_{BP}(n) = \text{sinc}_{LP}(n)\cos(\theta_0(n-k)) \quad n=0, \ldots, 2p \quad \text{Equation 20}$$

where $$k = \left\lfloor \frac{2p+1}{2} \right\rfloor.$$

Highpass Predictor Filter

A highpass predictor filter is designed by highpass modulating a lowpass prototype sinc function to the required corner frequency $\theta_c$. The highpass predictor coefficients $h_{HP}(n)$ are obtained from the prototype lowpass sinc function $h_{LP}(n)$ as:

$$\text{sinc}_{HP}(n) = \text{sinc}_{LP}(n)(-1)^{n-k} \quad n=0, \ldots, 2p \quad \text{Equation 21}$$

ΣΔ Modulator FPGA Implementation

The most challenging aspect of implementing the data modulator is producing an efficient implementation for the prediction filter P(z). The desire to support high-sample rates, and the requirement of zero latency for P(z), will preclude bit-serial methods from this problem. In addition, for the sake of area efficiency, parallel multipliers that exploit one time-invariant input operand (the filter coefficients) will be used, rather than general variable-variable multipliers. The constant-coefficient multiplier (KCM) is based on a multi-bit inspection version of Booth's algorithm. Partitioning the input variable into 4-bit nibbles is a convenient selection for the Xilinx Virtex function generators (FG). Each FG has 4 inputs and can be used for combinatorial logic or as application RAM/ROM. Each logic slice in the Virtex logic fabric comprises 2 FGs, and so can accommodate a 16×2 memory slice. Using the rule of thumb that each bit of filter coefficient precision contributes 5 dB to the sidelobe behavior, 12-bit precision is used for P(z). 12-bit precision will also be employed for the input samples. There are 3 4-bit nibbles in each input sample. Concurrently, each nibble addresses independent 16×16 lookup tables (LUTs). The bit growth incorporated here allows for worst case filter coefficient scaling in P(z). No pipeline stages are permitted in the multipliers because of P(z)'s location in the feedback path of the modulator.

It is convenient to use the transposed FIR filter for constructing the predictor. This allows the adders and delay elements in the structure to occupy a single slice. 64 slices are required to build the accumulate-delay path. The FPGA logic requirements for P(z), using a 9-tap predictor, is $\Gamma(P(z))=9\times40+64=424$ CLBs. A small amount of additional logic is required to complete the entire $\Sigma\Delta$ modulator. The final slice count is 450. The entire modulator comfortably operates with a 113 MHz clock. This clock frequency defines the system sample rate, so the architecture can support a throughput of 113 MSamples per second. The critical path through this part of the design is related to the exclusion of pipelining in the multipliers.

Reduced Complexity FIR Mechanization

Now that the input signal is available as a reduced precision sample stream, filtering can be performed using area-optimized hardware. For the reasons discussed above, 4-bit data samples are a convenient match for Virtex devices. FIG. 13 shows the structure of the reduced complexity FIR filter. The coded samples $\hat{x}(n)$ are presented to the address inputs of N coefficient LUTs. In accordance with the modulated data stream precision, each LUT stores the 16 possible scaled coefficient values for one tap as shown in FIG. 14. An N-tap filter requires N such elements. The outputs of the minimized multipliers are combined with an add-delay datapath to produce the final result. The logic requirement for the filter is $\Gamma(H(z))=N\Gamma(MUL)+(N-1)\Gamma(ADD\_z^{-1})$ where $\Gamma(MUL)$ and $\Gamma(ADD\_z^{-1})$ are the FPGA area cost functions for a KCM multiplier and an add-delay datapath component respectively.

Using full-precision input samples without any $\Sigma\Delta M$ encoding, each KCM would occupy 40 slices. The total cost of a direct implementation of H(z) is 7672 slices. The reduced precision KCMs used to process the encoded data each consume only 8 slices. Including the sigma-delta modulator the slice count is 3002 for the $\Sigma\Delta$ approach. So the data re-quantization approach consumes only 39% of the logic resources of a direct implementation.

$\Sigma\Delta$ Decimators

The procedure for re-quantizing the source data can also be used effectively in an m:1 decimation filter. An interesting problem is presented when high input sample rates ($\geq 150$ MHz) must be supported in FPGA technology. High-performance multipliers are typically realized by incorporating pipelining in the design. This naturally introduces some latency in to the system. The location of the predictor filter P(z) requires a zero-latency design. (It is possible that the predictor could be modified to predict samples further ahead in the time series, but this potential modification will not be dealt with in the limited space available.) Instead of re-quantizing, filtering and decimating, which would of course require a $\Sigma\Delta$ modulator running at the input sample rate, this sequence of operations is re-ordered to permit several slower modulators to be used in parallel. The process is performed by first decimating the signal, re-quantizing and then filtering. Now the $\Sigma\Delta$ modulators operate at the reduced output sample rate. This is depicted in FIG. 15. To support arbitrary center frequencies, and any arbitrary, but integer, down-sampling factor m, the bandpass decimation filter employs complex weights. The filter weights are of course just the bandpass modulated coefficients of a lowpass prototype filter designed to support the bandwidth of the target signal. Samples are collected from the A/D and alternated between the two modulators. Both modulators are identical and use the same predictor filter coefficients. The re-quantized samples are processed by an m:1 complex polyphase filter to produce the decimated signal. Several design options are presented once the signal has been filtered and the sample rate lowered. FIG. 15 illustrates one possibility. Now that the data rate has been reduced, the low rate signal is easily shifted to baseband with a simple, and area efficient, complex heterodyne. One multiplier and a single digital frequency synthesizer could be time shared to extract one or multiple channels.

It is interesting to investigate some of the changes that are required to support the $\Sigma\Delta$ decimator. The center frequency of the prediction filter should be designed to predict samples in the required spectral region in accordance with the output sample rate. For example, consider m=2, and the required channel center frequency located at 0.1 HZ, normalized with respect to the input sample rate. The prediction filter should be designed with a center frequency located at 0.2 Hz. In addition, the quality of the prediction should be improved. With respect to the output sample rate, the predictors are required to operate over a wider fractional bandwidth. This implies more filter coefficients in P(z). The increase in complexity of this component should be balanced against the savings that result in the reduced complexity filter stage to confirm that a net savings in logic requirements is produced. To more clearly demonstrate the approach, consider a 2:1 decimator, a channel center frequency at 0.2 Hz and a 60 dB dynamic range requirement.

FIG. 16($a$) shows the double-sided spectrum of the input test signal. The input signal is commutated between $\tau\Delta_0$ and $\Sigma\Delta_0$ to produce the two low-precision sequences $\hat{x}_0(n)$ and $\hat{x}_1(n)$. The respective spectrums of these two signals are shown in FIGS. 16($b$) and 16($c$). The complex decimation filter response is defined in FIG. 16($d$). After filtering, a complex sample stream supported at the low output sample rate is produced. This spectrum is shown in FIG. 16($e$). Observe that the out-of-band components in the test signal have been rejected by the specified amount and that the in-band data meets the 60 dB dynamic range requirement. For comparison, the signal spectrum resulting from applying the processing stages in the order, re-quantize, filter and decimate is shown in FIG. 16($f$). The interesting point to note is that while the dual $\Sigma\Delta$ modulator approach satisfies the system performance requirements, its out-of-band performance is not quite as good as the response depicted in FIG. 16($f$). The stopband performance of the dual modulator architecture has degraded by approximately 6 dB. This can be explained by noting that the shaping noise produced by each modulator is essentially statistically independent. Since there is no coupling between these two components prior to S1 filtering, complete phase cancellation of the modulator noise cannot occur in the polyphase filter.

SUMMARY

Sigma-delta modulation (ΣΔM) technology, together with FPGA based signal processing hardware, is combined to produce creative, high-performance and area-efficient solutions to many signal processing problems.

In one embodiment of the invention, a conventional DC canceler is modified to include a re-quantizer in the feedback loop in the form of a ΣΔ modulator. In such embodiments, the modulator can be a very simple 1st order loop that can easily be implemented using an FPGA.

In another embodiment, a digital receiver employs a processing chip, such as an FPGA, that includes a ΣΔ modulator to requantize oversampled control signals in the digital receiver. This embodiment enables an FPGA to generate analog signals to control low-bandwidth analog functions using minimal additional hardware.

Still another embodiment of the invention is a wide-bandwidth sigma-delta loop with a tunable center frequency. In this embodiment, a fixed set of feedback weights from a set of digital integrators defines a base-band filter with a desirable noise transfer function. The filter is tuned to arbitrary frequencies using a simple sub-processing element. The low-pass to band-pass transformation for a sampled data filter is achieved using an all-pass transfer function $G(z)$. In this embodiment, tuning is trivially accomplished by changing a multiplier in the all-pass network. The tuning multipliers can be implemented as full multipliers in FPGA hardware or as dynamically re-configured constant-coefficient multipliers.

This summary does not purport to define the invention, which is instead defined by the claims.

BRIEF DESCRIPTION OF THE FIGURES

FIG. 16(a) shows the double-sided spectrum of an input test signal for the decimators of FIG. 15.

FIG. 16(b) depicts the spectrum of sequence $\hat{x}_0(n)$ in the decimator of FIG. 15.

FIG. 16(c) depicts the spectrum of sequence $\hat{x}_1(n)$ in the decimator of FIG. 15.

FIG. 16(d) depicts the complex filter response for the decimation filter of FIG. 15.

DETAILED DESCRIPTION

To provide a frame of reference for the ΣΔ decimator, consider an implementation that does not pre-process the input data, but just applies it directly to a polyphase decimation filter. A complex filter processing real-valued data consumes double the FPGA resources of a filter with real weights. For N=160, 15344 CLBs are required. This Figure is based on a cost of 40 CLBs for each KCM and 8 CLBs for an add-delay component.

Now consider the logic accounting for the dual modulator approach. The area cost $\Gamma(\widehat{FIR})$ for this filter is $$\Gamma(\widehat{FIR})=2\delta(\Sigma\Delta)+\Gamma(\widehat{MUL}))+\Gamma(ACC\_z^{-1}) \quad \text{Equation 22}$$

where $\Gamma\Sigma\Delta$ represents the logic requirements for one $\Sigma\Delta$ modulator, and $\Gamma(\widehat{MUL})$ is the logic needed for a reduced precision multiplier. Using the filter specifications defined earlier, and 18-tap error prediction filters, $$\Gamma(\widehat{FIR})=2\times738+2\times((160+159)\times8)=6596.$$

Comparing the area requirements of the two options produces the ratio $$\lambda = \frac{\Gamma(\widehat{FIR})}{\Gamma FIR} = 6596/15344 \approx 43\% \quad \text{Equation 23}$$

So for this example, the re-quantization approach has produced a realization that is significantly more area efficient than a standard tapped-delay line implementation.

Center Frequency Tuning

For both the single-rate and multi-rate $\Sigma\Delta$ based architectures, the center frequency is defined by the coefficients in the predictor filter and the coefficients in the primary filter. The constant coefficient multipliers can be constructed using the FPGA function generators configured as RAM elements. When the system center frequency is to be changed, the system control hardware would update all of the tables to reflect the new channel requirements. If only several channel locations are anticipated, separate configuration bit streams could be stored, and the FPGA(s) re-configured as needed.

Bandpass $\Sigma\Delta$Ms Using Allpass Networks

Figure 17:
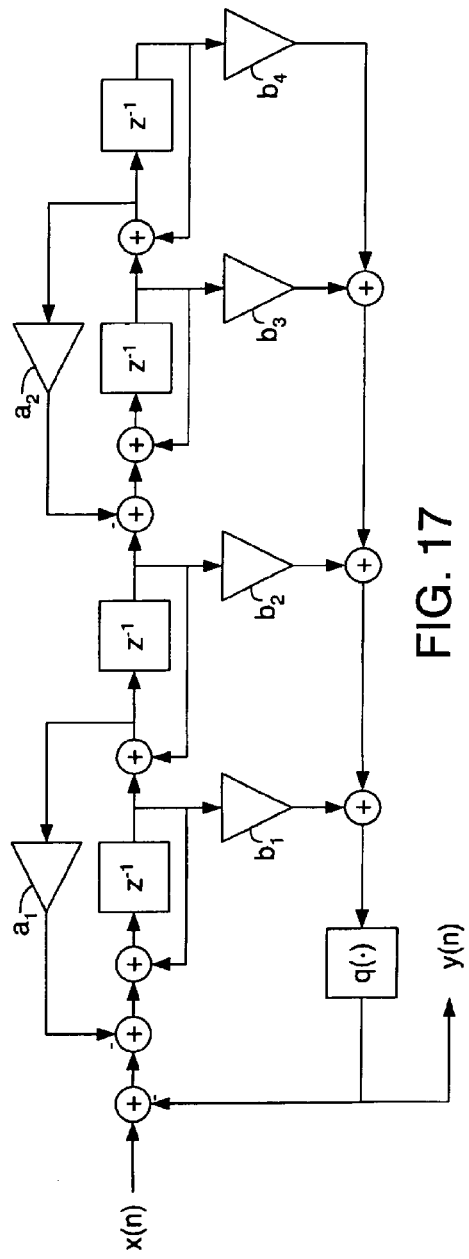
FIG. 17 depicts a fourth-order sigma-delta loop.
Figure 18A:
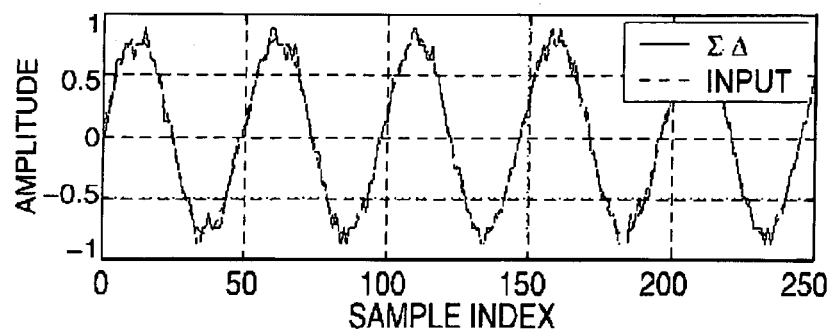
FIG. 18 depicts the time and spectrum obtained by using the loop of FIG. 17 with a 4-bit quantizer.
Figure 18B:
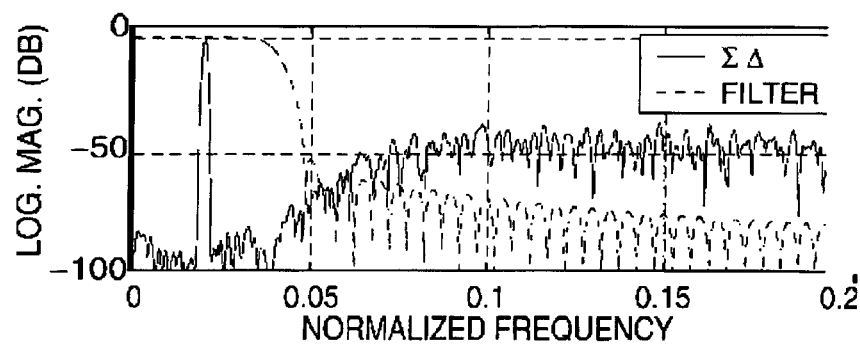

In an earlier section we discussed how to design a predicting filter for the feedback loop of a standard sigma delta modulator. The predicting filter increases the order of the modulator so that the modified structure has additional degrees of freedom relative to a single-delay noise feedback loop. These extra degrees of freedom have been used in two ways, first to broaden the bandwidth of the loop's noise transfer function, and second to tune its center frequency. The tuning process entailed an off line solution of the Normal equations which, while not difficult, does present a small delay and the need for a background processor. We can define a sigma-delta loop with a completely different architecture that offers the same flexibility, namely wider bandwidth and a tunable center frequency that does not require this background task. In this alternate architecture, a fixed set of feedback weights from a set of digital integrators defines a base-band prototype filter with a desirable NTF. The filter is tuned to arbitrary frequencies by attaching to each delay element $z^{-1}$, a simple sub-processing element that performs a base-band to band-pass transformation of the prototype filter. This processing element tunes the center frequency of its host prototype with a single real and selectable scalar. The structure of a fourth order prototype sigma-delta loop is shown in FIG. 17. The time and spectrum obtained by using the loop with a 4-bit quantizer is shown in FIG. 18. In this structure the digital integrator poles are located on the unit circle at DC. The local feedback (a1 and a2) separates the poles by sliding them along the unit circle, and the global feedback (b1, b2, b3 and b4) places these poles in the feedback path of the quantizer so they become noise transfer function zeros. These zeros are positioned to form an equal-ripple stop band for the NTF. The coefficients selected to match the NTF pole-zero locations to an elliptic high pass filter. The single sided bandwidth of this fourth order loop is approximately 4% of the input sample rate.

The low-pass to band-pass transformation for a sampled data filter is achieved by substituting an all-pass transfer function G(z) for the all-pass transfer function $z^{-1}$. This transformation is shown in equation 24.

$$z^{-1} \rightarrow -z^{-1}\left(\frac{1-cz}{z-c}\right) \quad \text{Equation 24}$$

Figures 19A, 19B:
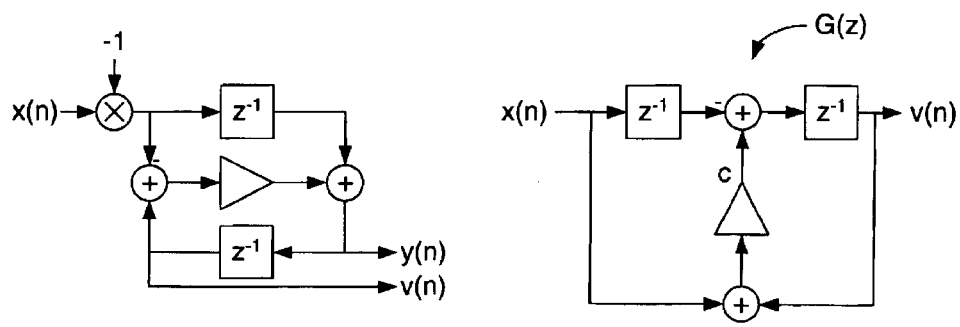
FIG. 19(a) is a block diagram of a digital filter with the transfer function $G(z)$.
FIG. 19(b) is a block diagram of a digital filter with the transfer function for $G(z)$ and having a co-efficient multiplier C.

A block diagram of a digital filter with the transfer function for G(z) is shown in FIG. 19. Examining the left hand block diagram, we find the transfer function from x(n) to y(n) is the all-pass network $-(1-cz)/(z-c)$, while the transfer function from x(n) to v(n) is $-(1/z)(1-cz)/(z-c)$. When we absorb the external negative sign change in the internal adders of the filter we obtain the simple right-hand side version of the desired transfer function G(z).

Figure 20:
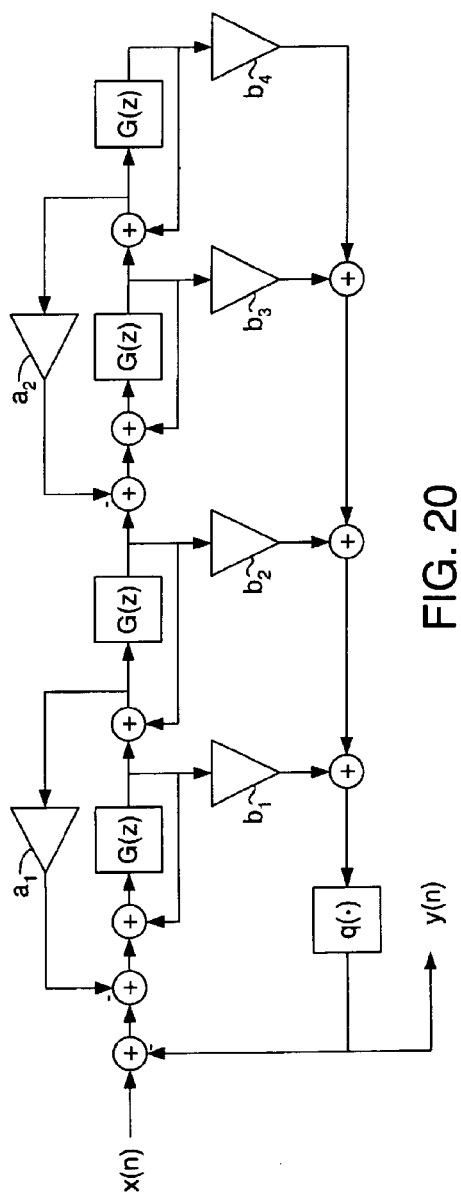
FIG. 20 depicts a tunable fourth order sigma-delta loop.

After the block diagram substitution has been made, we obtain FIG. 20, the tunable version of the low-pass prototype. The basic structure of the prototype remains the same when we replace the delay with the tunable all-pass network. The order of the filter is doubled by the substitution since each delay is replaced by a second order sub-filter. Tuning is trivially accomplished by changing the c multiplier of the all-pass network. The tuned version of the system reverts back to the prototype response if we set c to 1.

Figure 21:
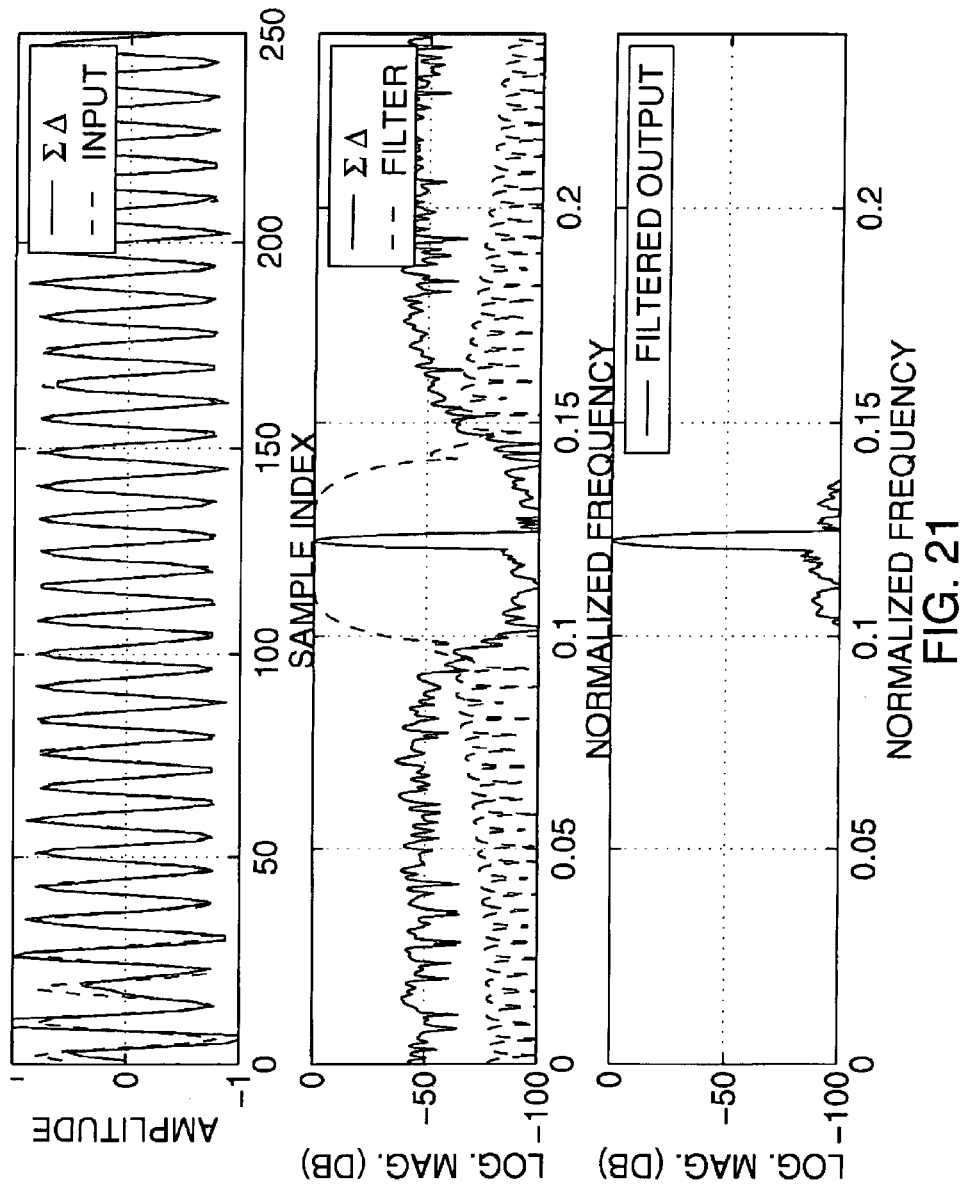
FIG. 21 depicts the time and spectrum obtained by using the tunable loop shown in FIG. 20.

FIG. 21 presents the time and spectrum obtained by using the tunable loop with a 4-bit quantizer shown in FIG. 20. The single sided bandwidth of the prototype filter is distributed to the positive and negative spectral bands of the tuned filter. Thus the two-sided bandwidth of each spectral band is approximately 4% of the input sample rate.

Figure 22:
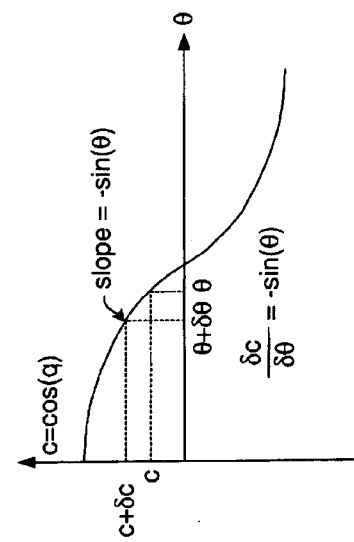
FIG. 22 is a graph depicting the relationship between the coefficient c and the center frequency for the loop of FIG. 20.

We now estimate the computational workload required to operate the prototype and tunable filter. The prototype filter has six coefficients to form the 4-poles and the 4-zeros of the transfer function. The two $a_k$ k=0,1 coefficients determine the four zero locations. These are small coefficients and can be set to simple binary scalers. The values computed for this filter for $a_1$ and $a_2$ were 0.0594 and 0.0110. These can be approximated by $\frac{1}{16}$ and $\frac{1}{128}$, which lead to no significant shift of the spectral zeros in the NTF. These simple multiplications are virtually free in the FPGA hardware since they are implemented with suitable wiring. The four coefficients $b_k$ k=0, . . . , 3 are 1.000, 0.6311, 0.1916, and 0.0283 respectively were replaced with coefficients containing one or two binary symbols to obtain values 1.000, $\frac{1}{2}+\frac{1}{8}$ (0.625), $\frac{1}{8}+\frac{1}{16}$ (0.1875) and $\frac{1}{32}$ (0.03125). When the sigma-delta loop ran with these coefficients there was no discernable change in bandwidth or attenuation level of the loop. The loop operates equally as well in the tuning mode and the non-tuning mode with the approximate coefficients listed above. Thus the only real multiplies in the tunable sigma-delta loop are the c coefficients of the all-pass networks. These networks are unconditionally stable and always exhibit all-pass behavior even in the presence of finite arithmetic and finite coefficients. This is because the same coefficient forms the numerator and the denominator. Errors in approximating the coefficients for c simply result in a frequency shift of the filter's tuned center. The c coefficient is determined from the cosine of the center frequency (in radians/sample). The curve for this relationship is shown in FIG. 22. Also shown is an error due to approximating c by $c+\delta c$. The question is, what is the change in center frequency $\theta$, from $\theta+\delta\theta$ due to the approximation of c? We can see that the slope at the operating point on the cosine curve is $-\sin$ θ so that δc/δθ≈−sin(θ) so that δc≈−δθ sin(θ) is the required precision to maintain a specified error. We note that tuning sensitivity is most severe for small frequencies where sin(θ) is near zero. The tolerance term, δθ sin(θ), is quadratic for small frequencies, but the lowest frequency that can be tuned by the loop is half the NTF pass-band bandwidth. For the fourth order system described here, this bandwidth is 4% of the sample rate, so the half-bandwidth angle is 2%, or 0.126 radians. To assure that the frequency to which the loop is tuned has an error smaller than 1% of center frequency, δc<δθ sin(θ)⇒δc<(0.126/100)(0.126)=0.0002, which corresponds to a 14 bit coefficient. An error of less than 10% center frequency can be achieved with 10 bit coefficients.

Figure 23:
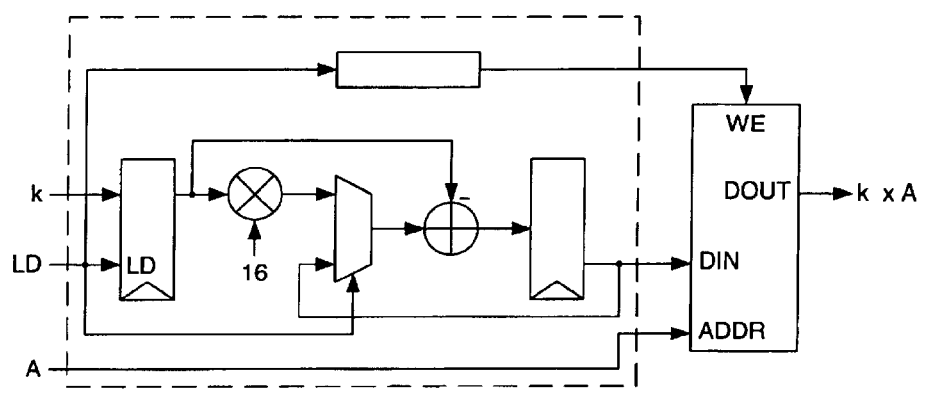
FIG. 23 depicts FPGA hardware adapted to implement a loadable constant coefficient multiplier.

The tuning multipliers could be implemented as full multipliers in the FPGA hardware or as dynamically re-configured KCMs, or KDCM, as shown in FIG. 23. The later approach conserves FPGA resources at the expense of introducing a start-up penalty each time the center frequency is changed. The start-up period is the initialization time of the KCM LUT. When a new center frequency is desired, the tuning constant is presented to the k input of the KDCM and the load signal LD is asserted. This starts the initialization engine, which requires 16 clock cycles to initialize 16 locations in the multiplier LUT. The initialization engine relies on the automatic shift mode of the Virtex LUTs. In this mode of operation a LUT's register contents are passed from one cell to the next cell on each clock tick. This avoids the requirement for a separate address generator and multiplexor in the initialization hardware. Observe from FIG. 23 that the initialization engine only introduces a small amount of additional hardware over that of a static KCM.

There is approximately a factor of 4 difference in the area of a KDCM and full multiplier.

ΣΔ DC Canceler

Unwanted DC components can be introduced into a DSP datapath at several places. It may be presented to the system via an un-trimmed offset in the analog-to-digital conversion pre-processing circuit, or may be attributed to bias in the A/D converter itself. Even if the sampled input signal has a zero mean, DC content can be introduced though arithmetic truncation processes in the fixed-point datapath. For example, in a multi-stage multi-rate filter, the intermediate filter output samples may be quantized between stages in order to compensate for the filter processing gain and thereby keep the word-length requirements manageable. The introduced DC bias can impact the dynamic range performance of a system and potentially increase the error rate in a digital receiver application.

In a fixed-point datapath, the bias can cause unnecessary saturation events that would not occur if the DC was not present in the system.

In a digital communication receiver employing M-ary QAM modulation, the DC bias can interfere with the symbol decision process, so causing incorrect decoding and therefore increasing the bit error rate.

In some cases the introduced bias can be ignored and is of no concern. However, for other applications it is desirable to remove the DC component.

One solution to removing the unwanted DC level is to employ a DC canceler.

Figure 24:
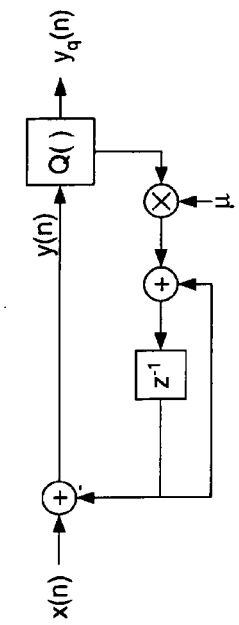
FIG. 24 depicts a simple DC canceler.

A simple canceler is shown in FIG. 24. It is easy to show that the transfer function of the network is $$H(z) = \frac{z-1}{z-(1-z)}$$ Equation 25

The cancellation is due to the transfer function zero at 0 Hz. The pole at $1-\mu$ controls the system bandwidth, and hence the system transient response. The location of the zero at z=1 removes the DC component in the signal, but there are some problems with a practical implementation of this circuit.

Figure 1:
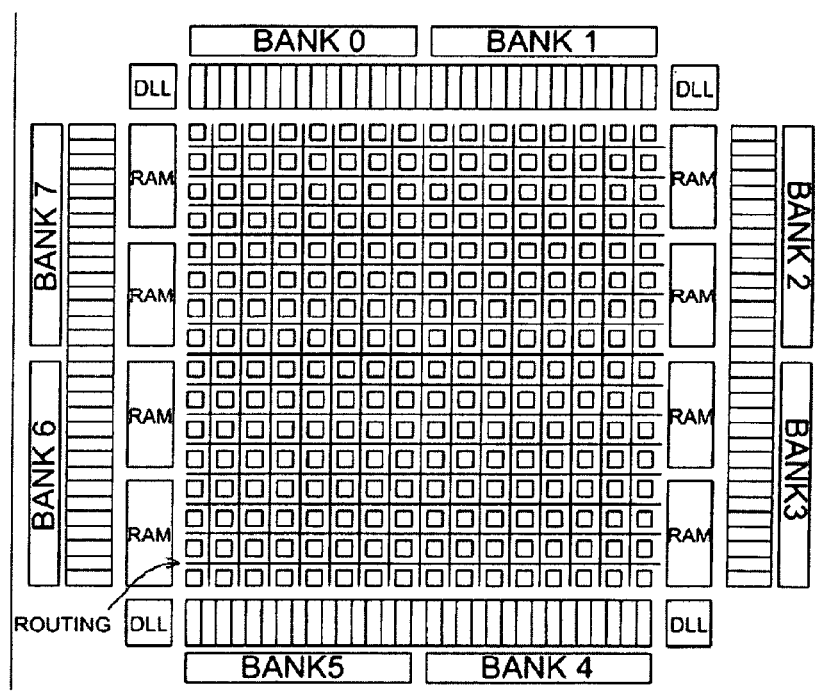
FIG. 1 depicts a generic FPGA architecture.
Figure 2:
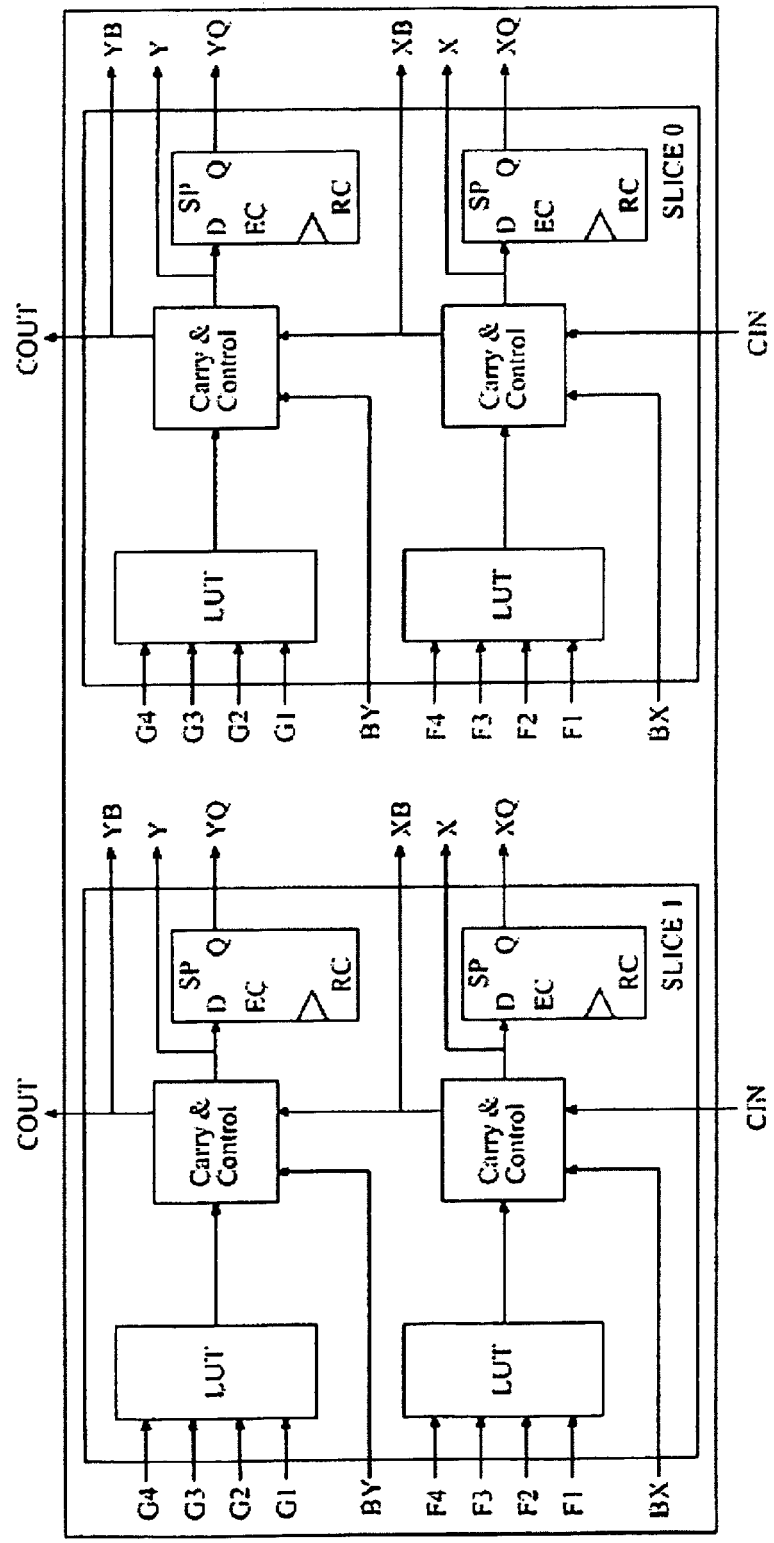
FIG. 2 depicts a configurable logic block (CLB) of a programmable logic device.
Figure 3:
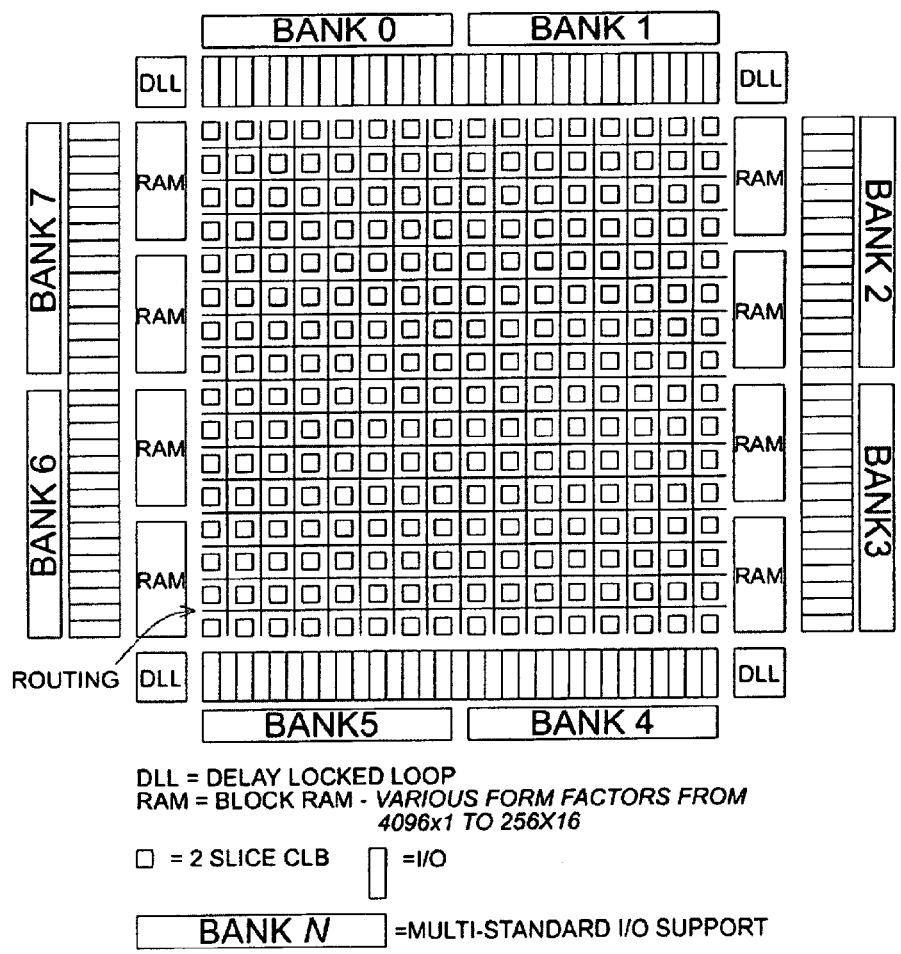
FIG. 3 shows the CLB matrix used in Xilinx Virtex FPGA's.
Figure 4:
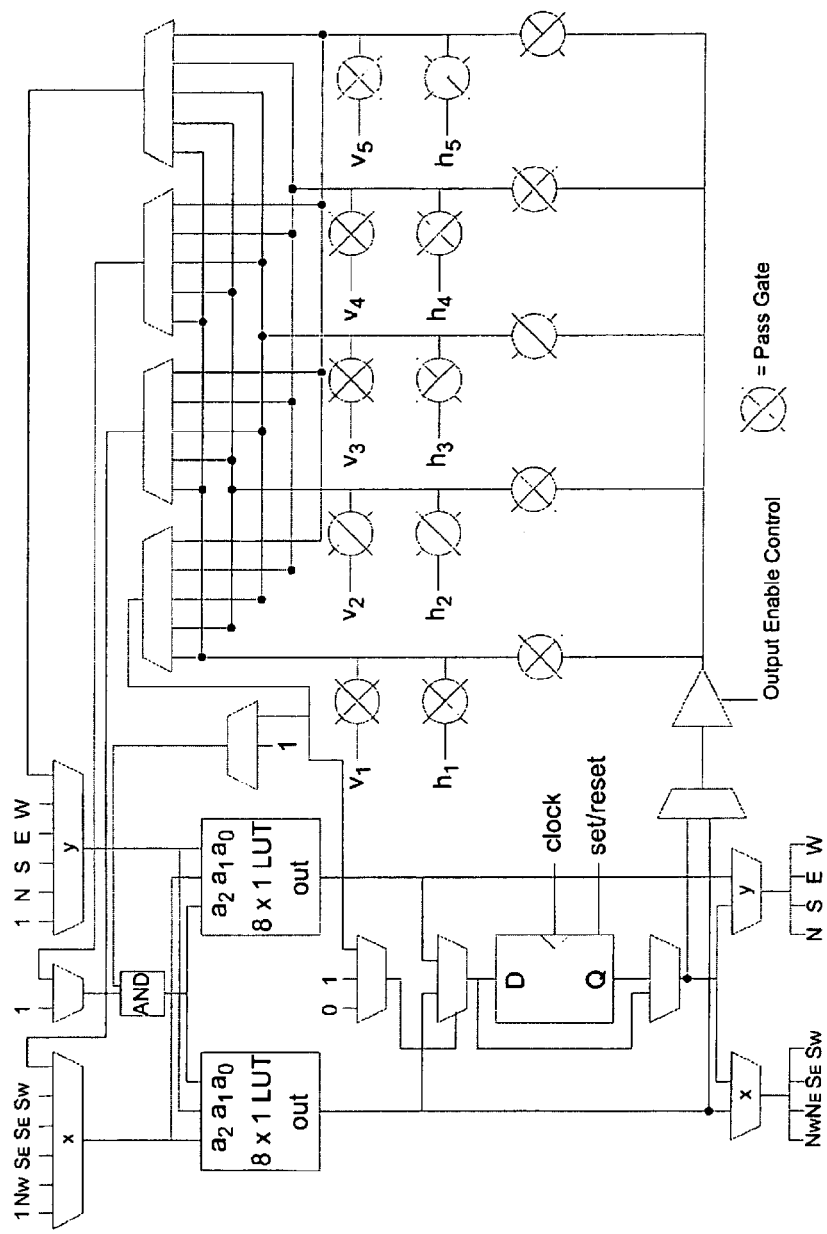
FIG. 4 shows a logic block architecture employed in the Atmel AT40K FPGA.
Figure 5:
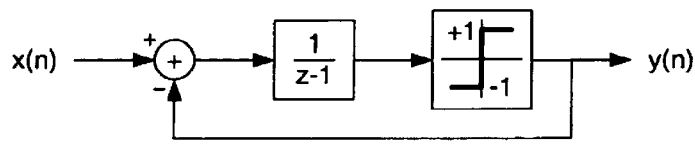
FIG. 5 shows a single-loop sigma-delta modulator.
Figure 6:
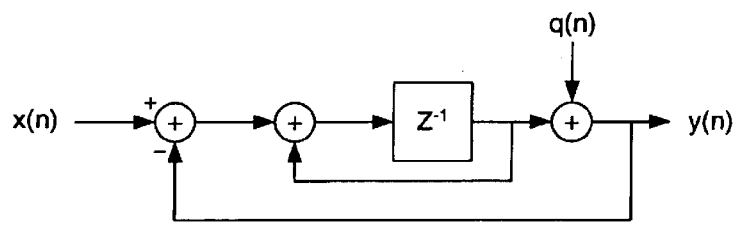
FIG. 6 shows a linearized discrete time model of a single-loop sigma-delta modulator.
Figure 7:
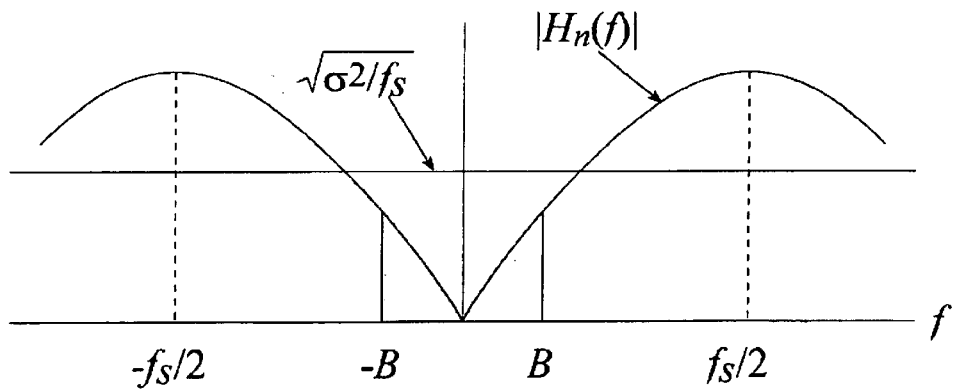
FIG. 7 depicts the noise transfer function of the modulator of FIG. 6.
Figure 8:
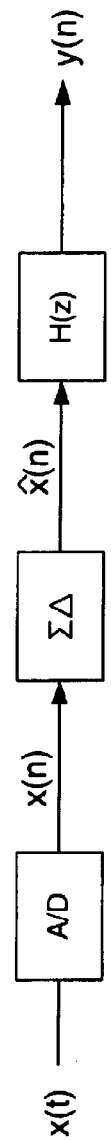
FIG. 8 depicts a filter system that includes a sigma-delta modulator.
Figure 9:
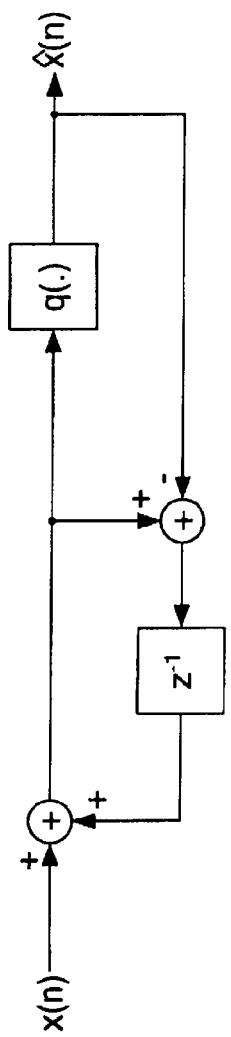
FIG. 9 depicts a single loop error feedback sigma-delta modulator.
Figure 10:
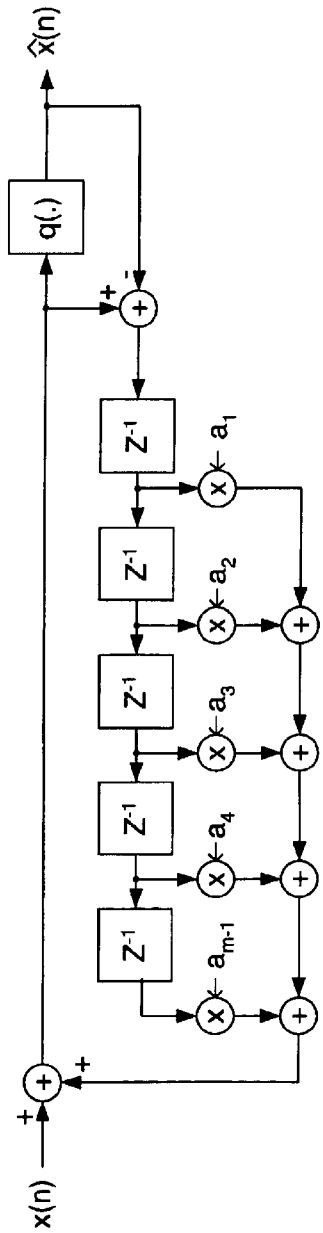
FIG. 10 depicts a tunable sigma-delta modulator using a linear filter in the feedback path.
Figure 12:
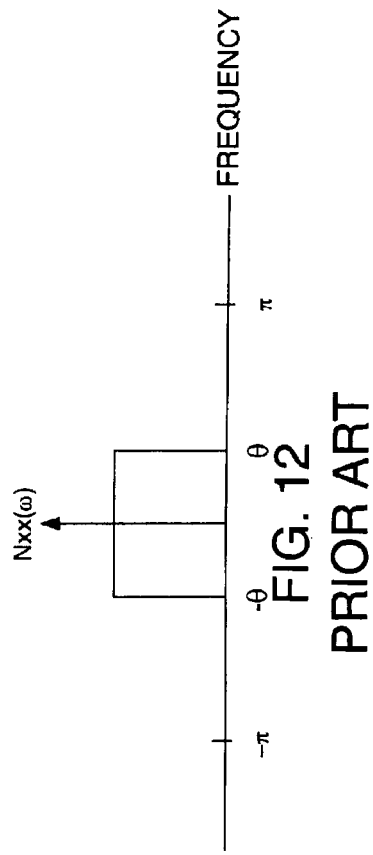
FIG. 12 is a frequency domain plot of band-limited white noise process $N_{xx}(\omega)$.
Figure 11A:
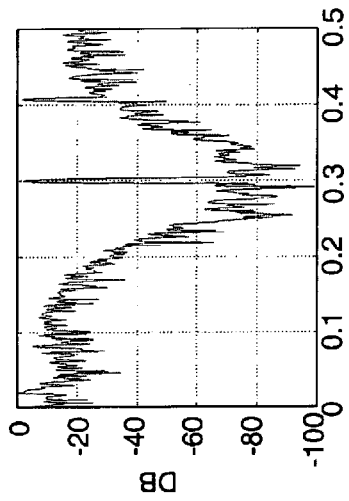
FIG. 11A is a frequency domain plot of an input test signal for the modulator in FIG. 10.
Figure 11B:
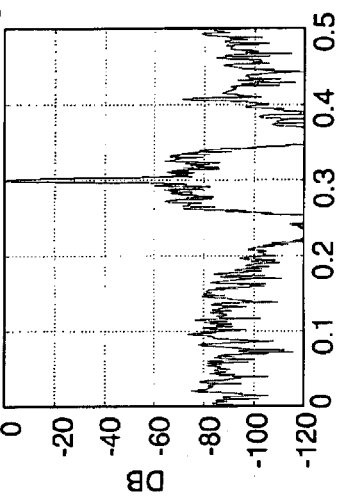
FIG. 11B is a frequency domain plot of the input test signal of FIG. 10.
Figure 11C:
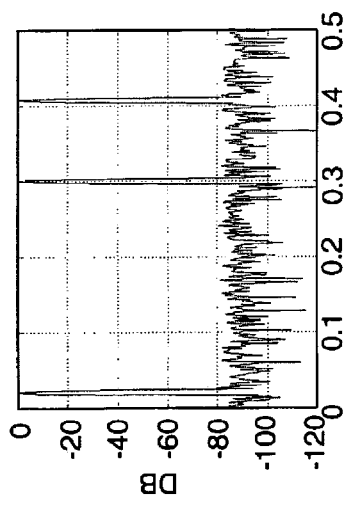
FIG. 11C is a frequency domain plot of the frequency response of a 160-tap filter $H(z)$.
Figure 11D:
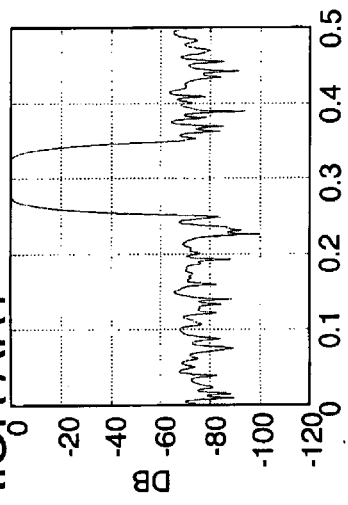
FIG. 11D is a frequency domain plot of a signal resulting from the application of filter $H(z)$ of FIG. 11C to re-quantized test signal of FIG. 11B.
Figure 13:
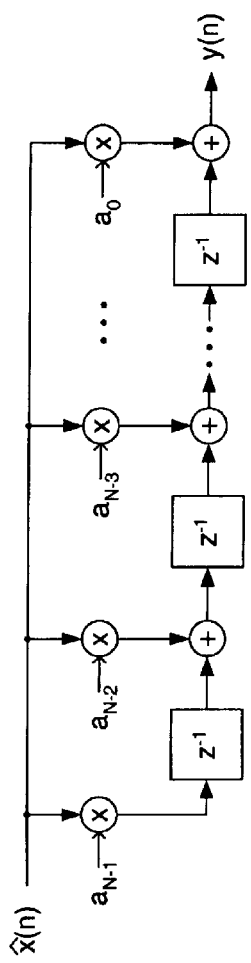
FIG. 13 depicts an FPGA FIR filter.
Figure 15:
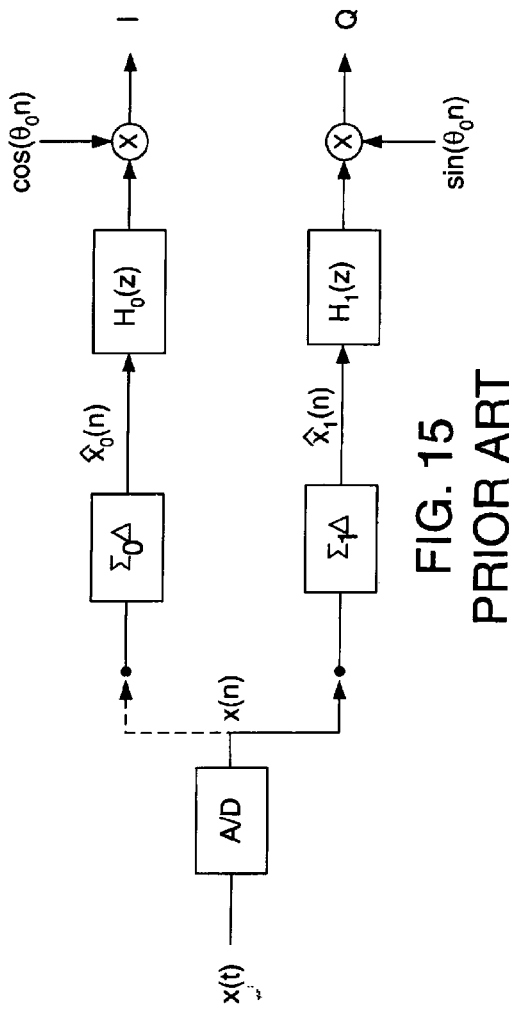
FIG. 15 depicts a decimation filter that includes two modulators operating in parallel.
Figure 14:
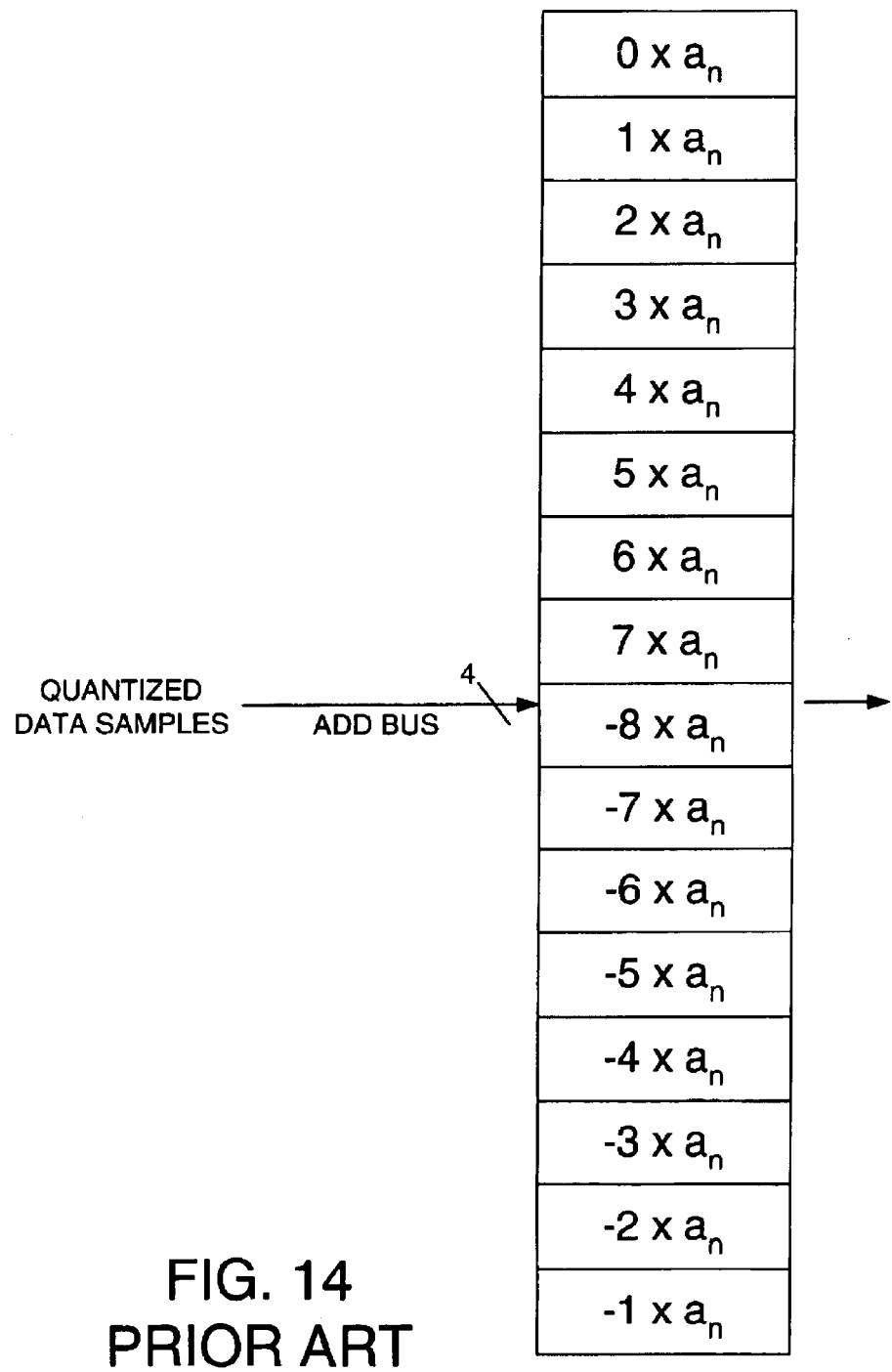
FIG. 14 depicts a look-up table storing 16 scaled co-efficient values for one tap of the FIR filter of FIG. 13.
Figure 16E:
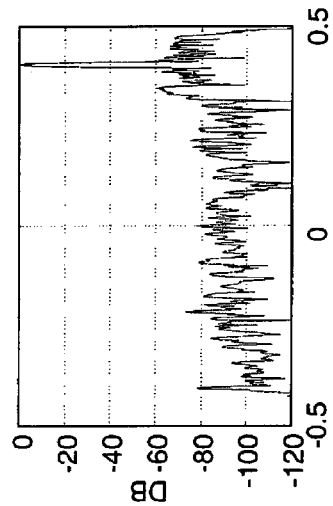
FIG. 16(e) depicts a complex sample stream produced by the decimation filter of FIG. 15.
Figure 16F:
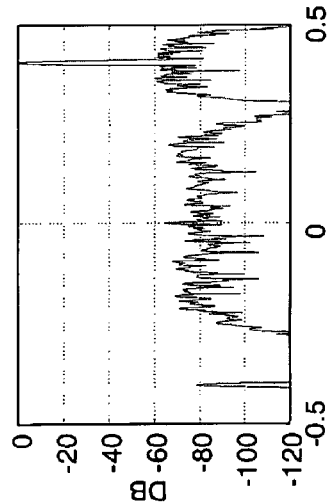
FIG. 16(f) depicts a signal spectrum resulting from applying the filter processing stages of FIG. 15 in a different order.
Figure 26:
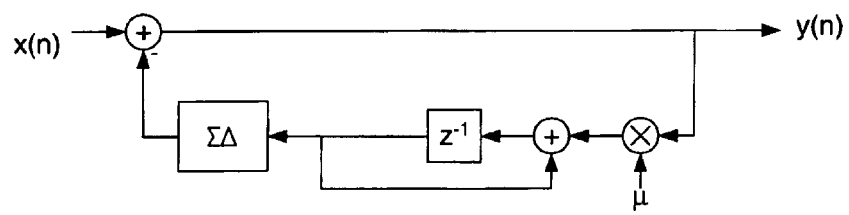
FIG. 26 depicts a DC canceler with a re-quantizer embedded in the feedback loop.
Figure 25A:
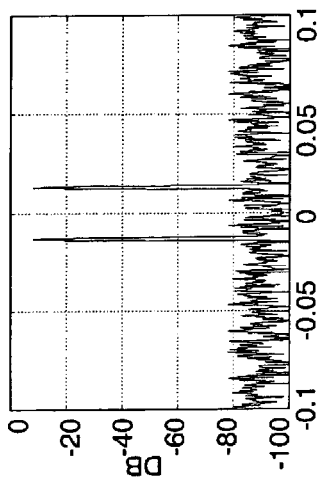
FIG. 25A is a spectral domain representation of a biased signal presented to the DC canceler of FIG. 24.
Figure 25B:
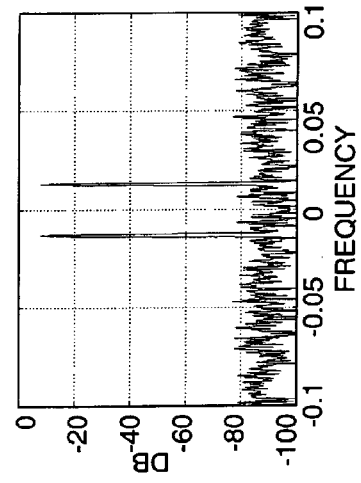
FIG. 25B is the processed signal spectrum at yq(n) in the DC canceler of FIG. 24.
Figure 25C:
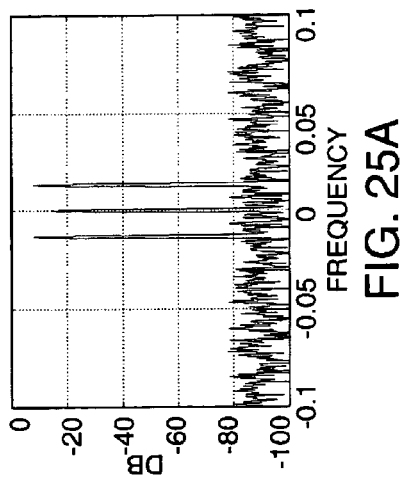
FIG. 25C depicts the signal spectrum at yq(n) using the quantizer Q (.).
Figure 25D:
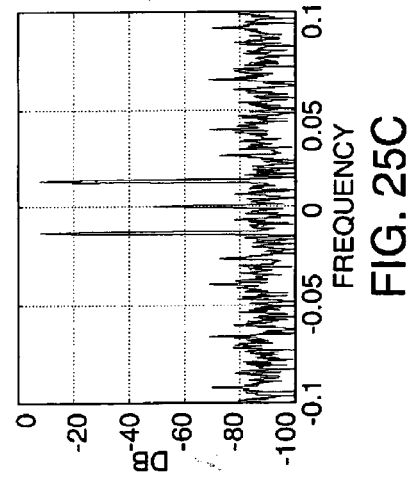
FIG. 25D demonstrates the operation of the DC canceler of FIG. 26 for 8-bit output data.

FIG. 25A is a spectral domain representation of a biased signal presented to the DC canceler. FIG. 25B is the processed signal spectrum at $y_q(n)$ in FIG. 24. We observe that the DC content in the input signal has been completely removed. However, in the process of running the canceling loop the network processing gain has caused a dynamic range expansion. So although the sample stream $y_q(n)$ is a zero mean process, it requires a larger number of bits to represent each sample than is desirable. The only option with the circuit is to re-quantize $y_q(n)$ to produce y(n) using the quantizer Q(•). The effect of this operation is shown in FIG. 25C, which demonstrates, not surprisingly, that after an 8-bit quantizer, the signal now has a DC component and we are almost back to where we started. How can the canceler be re-organized to avoid this implementation pitfall? One option is to embed the re-quantizer in the feedback loop in the form of a ΣΔ modulator as shown in FIG. 26. The modulator can be a very simple 1st order loop such as the error feedback ΣΔ modulator shown in FIG. 9. FIG. 25D demonstrates the operation of the circuit for 8-bit output data. Observe from the Figure that the DC has been removed from the signal while employing the same 8-bit output sample precision that was used in FIG. 24. The simple ΣΔM employed in the canceler is easily implemented in an FPGA.

Simplify Digital Receiver Control Loops Using ΣΔ Modulators

In earlier sections we recognized that when a sampled data input signal has a bandwidth that is a small fraction of its sample rate the sample components from this restricted bandwidth are highly correlated. We took advantage of that correlation to use a digital sigma-delta modulator to requantize the signal to a reduced number of bits. The sigma-delta modulator encodes the input signal with a reduced number of bits while preserving full input precision over the signal bandwidth by placing the increased noise due to requantization in out-of-band spectral positions that are already scheduled to be rejected by subsequent DSP processing. The purpose of this requantization is to allow the subsequent DSP processing to be performed with reduced arithmetic resource requirements since the desired data is now represented by a smaller number of bits.

Figure 27:
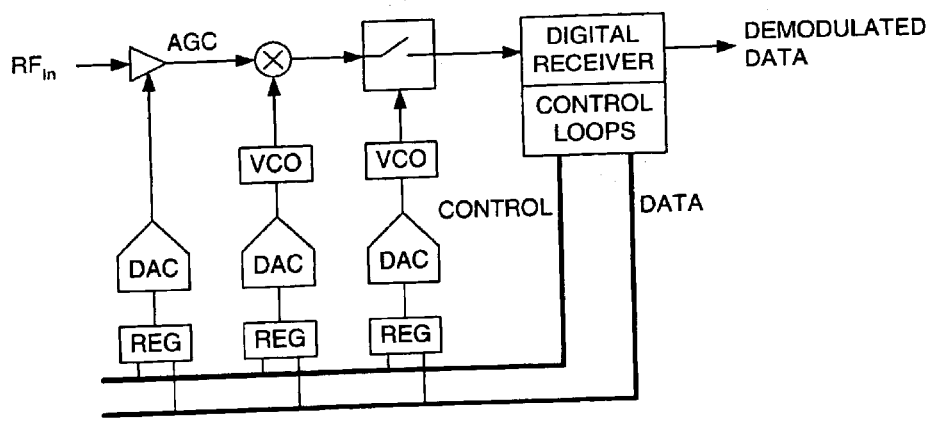
FIG. 27 depicts a digital receiver with feedback paths containing digital signals converted to analog control signals for analog components.

A similar remodulation of data samples can be employed for signals generated within a DSP process when the bandwidth of the signals are small compared to the sample rate of the process. A common example of this circumstance is the generation of control signals used in feedback paths of a digital receiver. These control signals include a gain control signal for a voltage controlled amplifier in an automatic gain control (AGC) loop and VCO (voltage controlled oscillator) control signals in carrier recovery and timing recovery loops. A block diagram of a receiver with these specific controls signals is shown in FIG. 27. The control signals are generated from processes operating at a sample rate appropriate to the input signal bandwidth. The bandwidth of control loops in a receiver are usually a very small fraction of the signal bandwidth, which means that the control signals are very heavily oversampled. As a typical example, in a cable TV modem, the input bandwidth is 6 MHz, the processing sample rate is 20 MHz, and the loop bandwidth may be 50 kHz. For this example, the ratio of sample rate to bandwidth is 400-to-1.

As seen in FIG. 27, the process of delivering these oversampled control signals to their respective control points entails the transfer of 16 bit words to external control registers, requiring appropriate busses, addressing, and enable lines as well as the operation of 16-bit digital-to-analog converters (DACs).

Figure 28:
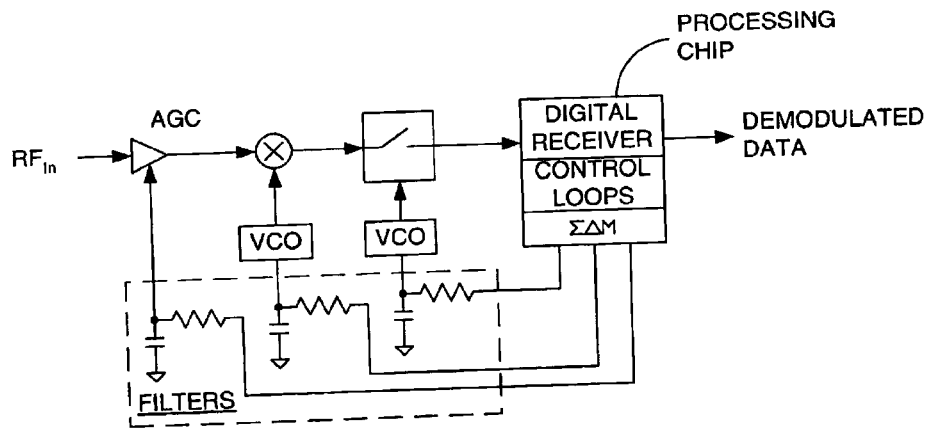
FIG. 28 depicts a digital receiver employing a sigma-delta modulator to facilitate simplified the feedback circuitry.
Figure 29:
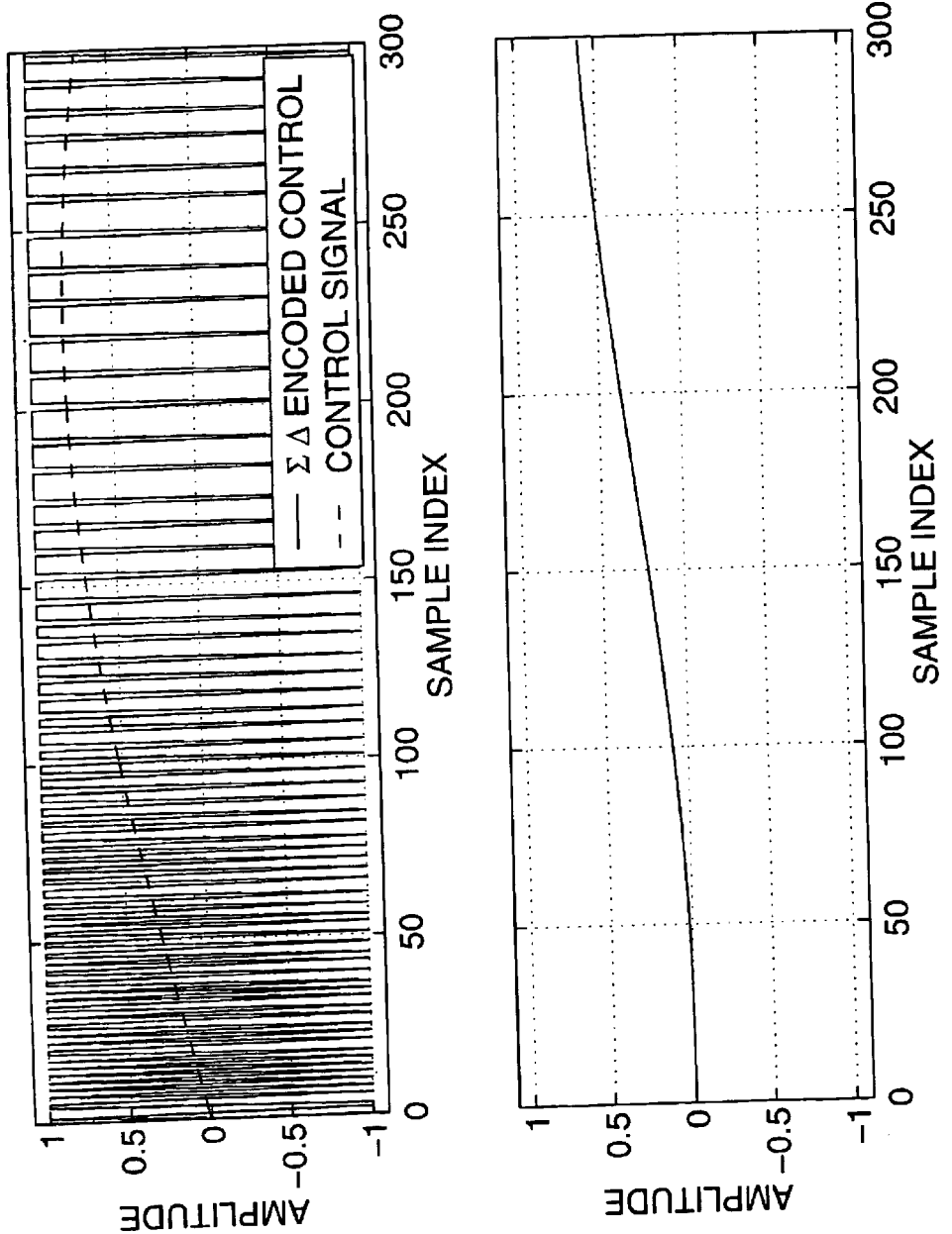
FIG. 29 shows the time responses of the one-bit two loop sigma-delta converter to a slowly varying control signal and the reconstructed signal obtained from the dual-RC filter.
Figure 30:
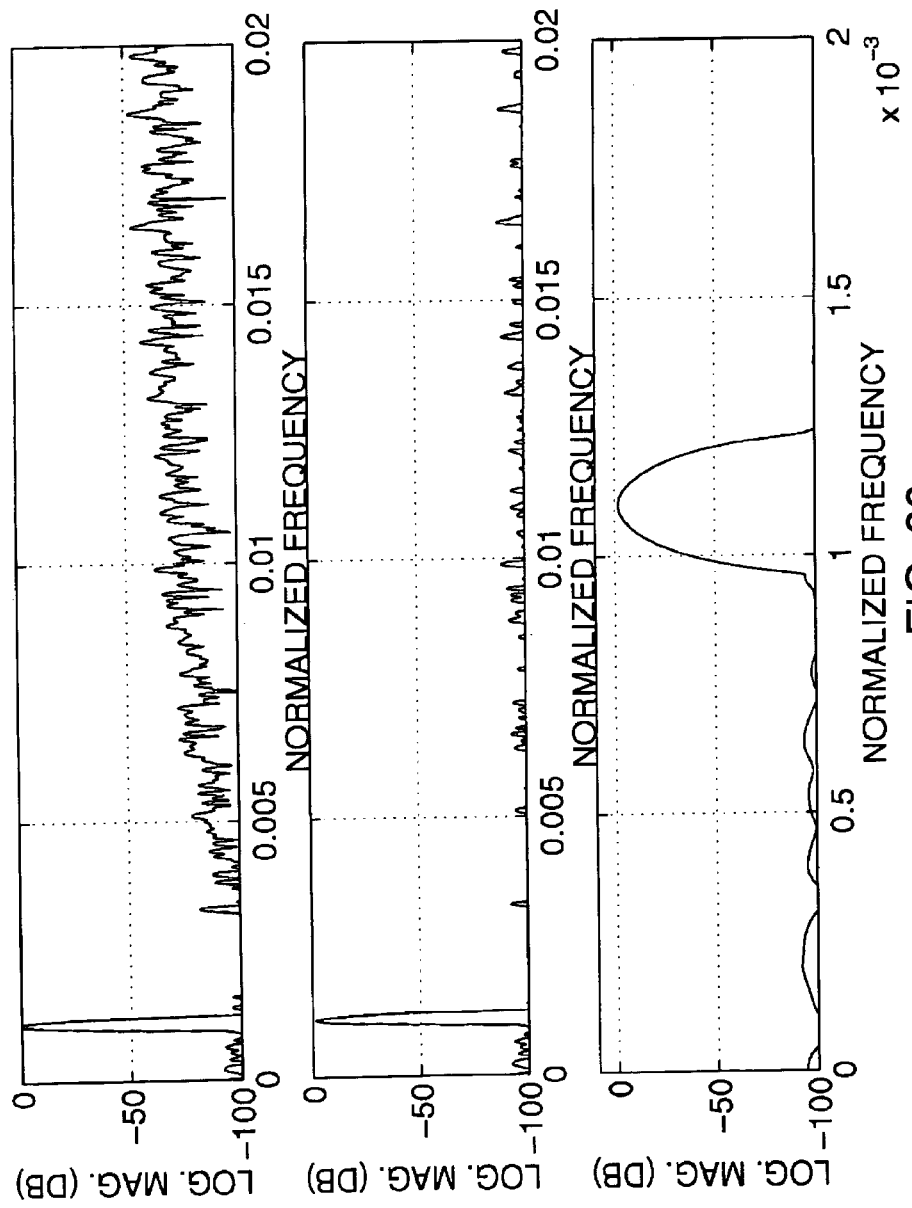
FIG. 30 shows the spectrum obtained from a 1-bit two-loop modulator and the spectrum obtained from an unbuffered RC—RC filter.

We can use a sigma-delta modulator to requantize the 16-bit oversampled control signals in the digital receiver prior to passing them out of the processing chip. The sigma-delta can preserve the required dynamic range over the signal's restricted bandwidth with a one-bit output. As suggested in FIG. 28, the transfer of a single bit to control the analog components is a significantly less difficult task than the original. We no longer require registers to accept the transfer, the busses to deliver the bits, or the DAC to convert the digital data to the analog levels the data represents. All that is needed a simple filter (and likely an analog amplifier to satisfy drive level and offset requirements). Experience shows that a 1-bit, one-loop sigma-delta modulator could achieve 80 dB dynamic range and requires a single RC filter to reconstruct the analog signal. A two-loop sigma-delta modulator is required to achieve 16-bit precision for which a double RC filter is required to reconstruct the analog output signal. FIG. 29 shows the time response of the one-bit two loop sigma-delta converter to a slowly varying control signal and the reconstructed signal obtained from the dual-RC filter. FIG. 30 shows the spectrum obtained from a 1-bit two-loop modulator and the spectrum obtained from an unbuffered RC-RC filter.

This example has shown how with minimal additional hardware, an FPGA can generate analog control signals to control low-bandwidth analog functions in a system. An observation worthy of note, is that the audio engineering community has recognized the advantage offered by this option of requantizing a 16-bit oversampled data stream to 1-bit data stream. In that community, the output signal is intentionally upsampled by a factor of 64 and then requantized to 1-bit in a process called a MASH converter. Nearly all CD players use the MASH converter to deliver analog audio signals.

What Have we Gained?

What has been achieved by expressing our signal processing problems in terms of $\Sigma\Delta M$ techniques? The paper has demonstrated some $\Sigma\Delta M$ techniques for the compact implementation of certain types of filter and control applications using FPGAs. This optimization can be used in several ways to bring economic benefits to a commercial design. By exploiting $\Sigma\Delta M$ filter processes, a given processing load may be realizable in a lower-density, and hence less expensive, FPGA than is possible without access to these techniques. An alternative would be to perform more processing using the same hardware. For example, processing multiple channels in a communication system.

In addition to FPGA area trade-offs, the $\Sigma\Delta M$ methods can result in reduced power consumption in a design. Power P may be expressed as $$P=CV^2 f_{clk} \quad \text{Equation 26}$$

where C is capacitance, V is voltage and f is the system clock frequency. By reducing the silicon area requirements of a filter, we can simultaneously reduce the power consumption of the design. For the examples considered earlier, logic resource savings of greater than 50% were demonstrated. The savings is proportional to increased efficiency in the system power budget, and this of course is very important for mobile applications.

The $\Sigma\Delta M$ AGC, timing and carrier recovery control loop designs are also important examples in a industrial context. The examples illustrated how the component count in a mixed analog/digital system can be reduced. In fact, not only is the component count reduced, but printed circuit board area is minimized. This results in more reliable and physically smaller implementations. The reduced component count also results in reduced power consumption. In addition, since the control loops no longer require wide output buses from the FPGA to multi-bit DACs that generate analog control voltages, power consumption is decreased because fewer FPGA I/O pads are being driven.

What is claimed is:

1. A DC canceler circuit comprising:
   a. a canceler input terminal adapted to receive a series of data input samples x(n);
   b. a canceler output terminal adapted to provide a series of data output samples y(n);
   c. a feedback path having:
      i. a feedback-path input terminal connected to the canceler output terminal;
      ii. a feedback-path output terminal connected to the canceler input terminal; and
      iii. a sigma-delta modulator having a sigma-delta input terminal indirectly connected to the feedback-path input terminal and a sigma-delta output terminal connected to the feedback-path output terminal.

2. The canceler circuit of claim 1, further comprising a subtractor having a first subtractor input node connected to the canceler input terminal and a second subtractor input node connected to the sigma-delta output terminal.

3. The canceler circuit of claim 1, further comprising a unit delay element having a delay-element input terminal indirectly connected to the feedback path input terminal and a delay-element output terminal connected to the sigma-delta input terminal.

4. The canceler circuit of claim 3, further comprising an adder having a first input terminal connected to the delay-element output terminal, a second input terminal indirectly connected to the feedback path input terminal, and an adder output terminal connected to the delay-element input terminal.

5. The canceler circuit of claim 4, wherein the adder connects to the feedback path input terminal via a multiplier.

6. A receiver comprising:
   a. a processing chip configured to include;
      i. a data input port;
      ii. a data output port;
      iii. sigma-delta modulator connected to the data input port and having a control-signal output port; and
   b. a feedback path connected between the control-signal output port and the data input port.

7. The receiver of claim 6, wherein the feedback path includes:
   a. an analog component having a filter input terminal; and
   b. an analog filter connected between the control-signal output port and the filter input terminal.

8. The receiver of claim 7, wherein the analog component includes an automatic gain control circuit.

9. The receiver of claim 7, wherein the analog component includes a voltage-controlled oscillator.

10. The receiver of claim 6, wherein the processing chip is programmable logic device.

11. The receiver of claim 10, wherein the programmable logic device is a field programmable gate array.

12. A sigma-delta loop having a tunable center frequency, the loop comprising:
   a. a data input terminal adapted to receive data x(n);
   b. a tunable all-pass network having an all-pass network input terminal indirectly connected to the data input terminal and an all-pass network output terminal;

c. a global feedback network connected between the all-pass network output terminal and the all-pass network input terminal; and d. a local feedback network connected between the all-pass network output terminal and the all-pass network input terminal;

wherein the sigma delta loop is used in a control loop application.

13. The sigma-delta loop of claim 12, further comprising a second tunable all-pass network having a second all-pass network input terminal, indirectly connected to the first-mentioned all-pass network output terminal, and a second all-pass network output terminal.

14. The sigma-delta loop of claim 12, wherein the global feedback network comprises:

a. a first co-efficient multiplier connected between the first-mentioned all-pass network output terminal and the first-mentioned all-pass network input terminal; and b. a second co-efficient multiplier connected between the second all-pass network output terminal and the first-mentioned all-pass network input terminal.

15. The sigma-delta loop of claim 14, further comprising a quantizer having a quantizer input terminal connected to the global feedback network and a quantizer output terminal connected to the first-mentioned all-pass network input terminal.

16. A tunable sigma-delta loop comprising:

a. a data input terminal adapted to receive data x(n);

b. a first subtractor having a first input terminal, a second input terminal, and an output terminal;

c. a second subtractor having a first input terminal connected to the output terminal of the first subtractor, a second input terminal, and an output terminal;

d. a first adder having a first input terminal connected to the output terminal of the second adder subtractor, a second input terminal, and an output terminal;

e. a tunable all-pass network having an all-pass network input terminal connected to the output terminal of the first adder and an all-pass network output terminal connected to the second input terminal of the first adder;

f. a local feedback network having a local-feedback input terminal connected to the all-pass network output terminal and a local-feedback output terminal connected to the second input terminal of the second subtractor;

g. a global feedback network having a global-feedback input terminal connected to the all-pass network output terminal and a global-feedback output terminal; and h. a quantizer having a quantizer input terminal connected to the global-feedback output terminal and a quantizer output terminal connected to the second input terminal of the first subtractor;

wherein the sigma delta loop is used in a control loop application.

17. The loop of claim 16, further comprising:

a. a second adder having a first adder input terminal connected to the first-mentioned all-pass network output terminal, a second adder input terminal, and an adder output terminal connected to the local-feedback input terminal;

b. a second tunable all-pass network having an all-pass network input terminal connected to the output terminal of the second adder and a all-pass network output terminal connected to the second input terminal of the second adder;

c. a second global-feedback network having a global-feedback input terminal connected to the all-pass network output terminal of the second all-bass network and a global-feedback output terminal;

d. a third adder having a first input terminal connected to the global-feedback output terminal of the first-mentioned global feedback network, a second input terminal connected to the global-feedback output terminal of the second global feedback network, and an output terminal connected to the quantizer input terminal.

* * * * *